US009028087B2

(12) United States Patent
Wilcox et al.

(10) Patent No.: US 9,028,087 B2
(45) Date of Patent: May 12, 2015

(54) LED LIGHT FIXTURE

(71) Applicant: Cree, Inc., Durham, NC (US)

(72) Inventors: Kurt S. Wilcox, Libertyville, IL (US); Brian Kinnune, Racine, WI (US); Nathan Snell, Raleigh, NC (US); Jeremy Sorenson, Oak Creek, WI (US); Corey Goldstein, Kenosha, WI (US); Nicholas W. Medendorp, Jr., Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 14/246,776

(22) Filed: Apr. 7, 2014

(65) Prior Publication Data

US 2014/0218941 A1 Aug. 7, 2014

Related U.S. Application Data

(63) Continuation-in-part of application No. 13/764,743, filed on Feb. 11, 2013, and a continuation-in-part of application No. 13/834,525, filed on Mar. 15, 2013, which is a continuation of application No. 13/294,459, (Continued)

(51) Int. Cl.

*H01L 23/34* (2006.01)
*F21V 15/01* (2006.01)

(Continued)

(52) U.S. Cl.

CPC ............... *F21V 15/011* (2013.01); *F21V 27/00* (2013.01); *F21V 29/2206* (2013.01); *F21V 29/225* (2013.01); *F21V 29/2262* (2013.01); *F21V 29/2293* (2013.01); *F21V 29/26* (2013.01); *F21V 31/03* (2013.01); *F21S 8/033* (2013.01); *F21S 8/086* (2013.01); *F21S 9/022* (2013.01); *F21V 19/003* (2013.01); *F21V 19/045* (2013.01); *F21V 21/30* (2013.01);

(Continued)

(58) Field of Classification Search

USPC ............................ 362/249.02, 294, 373, 218

See application file for complete search history.

(56) References Cited

U.S. PATENT DOCUMENTS 1,225,301 A 5/1917 Wolfe
2,772,382 A 11/1956 Escoffery (Continued)

FOREIGN PATENT DOCUMENTS

CN ZL200420110545 12/2004
CN 1737418 A 8/2005

(Continued)

OTHER PUBLICATIONS

Kramer Lighting, Sturtevant, WI. Excerpts from Kramer Lighting brochure. Quartz Cylinder Downlight specification. Copyright 2010.

(Continued)

*Primary Examiner* — Anabel Ton

(74) *Attorney, Agent, or Firm* — Jansson Munger McKinley & Shape Ltd.

(57) ABSTRACT

An LED light fixture including a housing and an LED assembly secured with respect to the housing. The LED assembly includes a heat sink and an LED illuminator secured with respect to an LED-supporting region of the heat sink with heat-dissipating surfaces extending therefrom. The heat sink having front, rear and lateral sides and being open to ambient-fluid flow to and from the heat-dissipating surfaces along each of the sides.

30 Claims, 24 Drawing Sheets

Related U.S. Application Data filed on Nov. 11, 2011, now Pat. No. 8,425,071, which is a continuation of application No. 12/629,986, filed on Dec. 3, 2009, now Pat. No. 8,070,306, which is a continuation of application No. 11/860,887, filed on Sep. 25, 2007, now Pat. No. 7,686,469, which is a continuation-in-part of application No. 11/541,908, filed on Sep. 30, 2006, now abandoned, application No. 14/246,776, which is a continuation-in-part of application No. 13/764,736, filed on Feb. 11, 2013, and a continuation-in-part of application No. 13/764,746, filed on Feb. 11, 2013, and a continuation-in-part of application No. 13/839,922, filed on Mar. 15, 2013, and a continuation-in-part of application No. 13/680,481, filed on Nov. 19, 2012, now Pat. No. 8,622,584, which is a continuation of application No. 13/333,198, filed on Dec. 21, 2011, now Pat. No. 8,313,222, which is a continuation of application No. 12/418,364, filed on Apr. 3, 2009, now Pat. No. 8,092,049.

(60) Provisional application No. 61/042,690, filed on Apr. 4, 2008, provisional application No. 61/624,211, filed on Apr. 13, 2012.

(51) Int. Cl.

| | |
|---|---|
| ***F21V 27/00*** | (2006.01) |
| ***F21V 29/00*** | (2006.01) |
| ***F21V 31/03*** | (2006.01) |
| ***F21S 8/00*** | (2006.01) |
| ***F21S 8/08*** | (2006.01) |
| ***F21S 9/02*** | (2006.01) |
| ***F21V 19/00*** | (2006.01) |
| ***F21V 19/04*** | (2006.01) |
| ***F21V 21/30*** | (2006.01) |
| ***F21V 23/02*** | (2006.01) |
| *F21K 99/00* | (2010.01) |
| *F21V 21/005* | (2006.01) |
| *F21V 21/116* | (2006.01) |
| *F21W 131/10* | (2006.01) |
| *F21W 131/103* | (2006.01) |
| *F21Y 101/02* | (2006.01) |
| *F21Y 105/00* | (2006.01) |

(52) U.S. Cl.

CPC .................. *F21V 23/02* (2013.01); *F21K 9/30* (2013.01); *F21V 21/005* (2013.01); *F21V 21/116* (2013.01); *F21W 2131/10* (2013.01); *F21W 2131/103* (2013.01); *F21Y 2101/02* (2013.01); *F21Y 2105/001* (2013.01); *Y10S 362/80* (2013.01)

(56) References Cited

U.S. PATENT DOCUMENTS

| | | | |
|---|---|---|---|
| 3,184,199 | A | 5/1965 | Clark et al. |
| 3,652,047 | A | 3/1972 | Starr |
| 3,800,177 | A | 3/1974 | Russ |
| 3,819,929 | A | 6/1974 | Newman |
| 3,860,829 | A | 1/1975 | Fabbri |
| 3,889,147 | A | 6/1975 | Groves |
| D246,203 | S | 10/1977 | Harris |
| 4,071,749 | A | 1/1978 | Balogh |
| 4,156,891 | A | 5/1979 | Roche |
| 4,167,033 | A | 9/1979 | Fletcher |
| 4,187,711 | A | 2/1980 | Lavochkin et al. |
| 4,203,488 | A | 5/1980 | Johnson et al. |
| 4,228,489 | A | 10/1980 | Martin |
| 4,235,285 | A | 11/1980 | Johnson et al. |
| 4,254,453 | A | 3/1981 | Mouyard et al. |
| 4,264,946 | A | 4/1981 | Faux et al. |
| D266,080 | S | 9/1982 | Asanuma |
| D266,081 | S | 9/1982 | Asanuma |
| D266,082 | S | 9/1982 | Asanuma |
| 4,426,676 | A | 1/1984 | Taylor |
| 4,460,945 | A | 7/1984 | Chan et al. |
| D275,749 | S | 10/1984 | McCarthy |
| 4,508,163 | A | 4/1985 | McCarthy |
| 4,552,206 | A | 11/1985 | Johnson et al. |
| D285,194 | S | 8/1986 | McCarthy |
| 4,679,118 | A | 7/1987 | Johnson et al. |
| 4,729,076 | A | 3/1988 | Masami et al. |
| D296,778 | S | 7/1988 | McCarthy |
| 4,787,019 | A | 11/1988 | Van Den Broeke et al. |
| 4,793,581 | A | 12/1988 | Bilson et al. |
| 4,875,057 | A | 10/1989 | Hediger et al. |
| 4,899,210 | A | 2/1990 | Lorenzetti et al. |
| 4,931,917 | A | 6/1990 | Scherf et al. |
| 5,004,953 | A | 4/1991 | McDonald |
| 5,119,174 | A | 6/1992 | Chen |
| 5,136,493 | A | 8/1992 | Straus et al. |
| 5,172,755 | A | 12/1992 | Samarov |
| 5,226,723 | A | 7/1993 | Chen |
| D338,449 | S | 8/1993 | Sahyoun |
| 5,274,250 | A | 12/1993 | Miyake et al. |
| 5,285,350 | A | 2/1994 | Villaume |
| 5,303,124 | A | 4/1994 | Wrobel |
| 5,304,735 | A | 4/1994 | Earl et al. |
| 5,381,041 | A | 1/1995 | Harmon |
| 5,381,305 | A | 1/1995 | Harmon et al. |
| 5,384,940 | A | 1/1995 | Soule et al. |
| 5,398,177 | A | 3/1995 | Harwood et al. |
| 5,436,798 | A | 7/1995 | Wieland, Jr. |
| D361,317 | S | 8/1995 | Harmon et al. |
| D361,986 | S | 9/1995 | Harmon |
| 5,494,098 | A | 2/1996 | Morosas |
| 5,562,146 | A | 10/1996 | Harmon et al. |
| 5,576,933 | A | 11/1996 | Campanella et al. |
| D376,349 | S | 12/1996 | Campanella et al. |
| 5,581,442 | A | 12/1996 | Morosas |
| 5,586,004 | A | 12/1996 | Green et al. |
| 5,593,225 | A | 1/1997 | Safyan |
| 5,611,393 | A | 3/1997 | Vasconcelos et al. |
| 5,617,131 | A | 4/1997 | Murano et al. |
| 5,623,551 | A | 4/1997 | East et al. |
| 5,633,564 | A | 5/1997 | Edwards et al. |
| 5,660,461 | A | 8/1997 | Ignatius et al. |
| D384,040 | S | 9/1997 | Frerichs et al. |
| 5,676,455 | A | 10/1997 | Johnson et al. |
| 5,711,890 | A | 1/1998 | Hawkins et al. |
| D390,539 | S | 2/1998 | Campanella |
| D394,043 | S | 5/1998 | Campanella et al. |
| 5,771,155 | A | 6/1998 | Cook |
| 5,782,555 | A | 7/1998 | Hochstein |
| 5,796,154 | A | 8/1998 | Sano et al. |
| 5,857,767 | A | 1/1999 | Hochstein |
| D407,381 | S | 3/1999 | Campanella |
| 5,894,882 | A | 4/1999 | Kikuchi et al. |
| 5,896,288 | A | 4/1999 | Lecheler et al. |
| 5,909,062 | A | 6/1999 | Krietzman |
| 5,936,353 | A | 8/1999 | Triner et al. |
| 5,984,494 | A | 11/1999 | Chapman et al. |
| 5,988,829 | A | 11/1999 | Holder |
| 6,011,299 | A | 1/2000 | Brench |
| 6,045,232 | A | 4/2000 | Buckmaster |
| 6,045,239 | A | 4/2000 | Waldmann et al. |
| 6,045,240 | A | 4/2000 | Hochstein |
| 6,056,254 | A | 5/2000 | Albright et al. |
| 6,155,701 | A | 12/2000 | Leen |
| D442,565 | S | 5/2001 | Chou et al. |
| D442,566 | S | 5/2001 | Chou et al. |
| 6,227,684 | B1 | 5/2001 | Wijbenga et al. |
| 6,229,160 | B1 | 5/2001 | Krames et al. |
| D445,922 | S | 7/2001 | Yasuoka |
| 6,255,786 | B1 | 7/2001 | Yen |
| 6,274,924 | B1 | 8/2001 | Carey et al. |
| D450,306 | S | 11/2001 | Lin et al. |
| 6,323,063 | B2 | 11/2001 | Krames et al. |

(56) References Cited

U.S. PATENT DOCUMENTS 6,325,524 B1 12/2001 Weber et al.
6,329,593 B1 12/2001 Yang
6,357,895 B1 3/2002 Kierulf et al.
6,375,340 B1 4/2002 Biebl et al.
6,401,806 B1 6/2002 Lee et al.
6,414,343 B1 7/2002 Kondo et al.
6,428,189 B1 8/2002 Hochstein
6,449,151 B1 9/2002 Chen
6,457,837 B1 10/2002 Steffensmeier
D465,462 S 11/2002 Hsieh
6,481,874 B2 11/2002 Petroski
6,486,499 B1 11/2002 Krames et al.
6,498,355 B1 12/2002 Harrah et al.
6,501,103 B1 12/2002 Jory et al.
6,502,956 B1 1/2003 Wu
6,517,218 B2 2/2003 Hochstein
6,521,914 B2 2/2003 Krames et al.
6,522,263 B2 2/2003 Jones
6,527,422 B1 3/2003 Hutchison
6,529,375 B2 3/2003 Miyahara et al.
6,547,249 B2 4/2003 Collins, III et al.
6,554,451 B1 4/2003 Keuper
6,558,021 B2 5/2003 Wu et al.
6,565,238 B1 5/2003 Pyrtle
6,570,190 B2 5/2003 Krames et al.
6,578,986 B2 6/2003 Swaris et al.
6,612,717 B2 9/2003 Yen
6,614,103 B1 9/2003 Durocher et al.
D481,017 S 10/2003 Hsia et al.
6,630,736 B1 10/2003 Ignaut
6,635,911 B2 10/2003 Maruyama
6,635,941 B2 10/2003 Suda
6,641,284 B2 11/2003 Stopa et al.
6,648,496 B1 11/2003 Elghoroury et al.
6,657,862 B2 12/2003 Crocker et al.
6,666,567 B1 12/2003 Feldman et al.
6,676,279 B1 1/2004 Hubbell et al.
6,688,380 B2 2/2004 Lavochkin et al.
6,720,566 B2 4/2004 Blandford
6,730,940 B1 5/2004 Steranka et al.
D493,151 S 7/2004 Lee
D494,549 S 8/2004 Lee
6,784,357 B1 8/2004 Wang
6,815,724 B2 11/2004 Dry
6,834,981 B2 12/2004 Nagai et al.
6,837,605 B2 1/2005 Reill
6,841,931 B2 1/2005 Takahashi et al.
6,851,831 B2 2/2005 Karlicek, Jr.
6,857,767 B2 2/2005 Matsui et al.
6,860,620 B2 3/2005 Kuan et al.
6,864,513 B2 3/2005 Lin et al.
6,871,993 B2 3/2005 Hecht
6,876,008 B2 4/2005 Bhat et al.
6,885,035 B2 4/2005 Bhat et al.
D505,220 S 5/2005 Stekelenburg
6,893,941 B2 5/2005 Suda
6,914,261 B2 7/2005 Ho
RE38,767 E 8/2005 Wedell et al.
6,932,495 B2 8/2005 Sloan et al.
6,934,153 B2 8/2005 Lee et al.
6,935,410 B2 8/2005 Lee et al.
6,957,905 B1 10/2005 Pritchard et al.
6,958,914 B2 10/2005 Hoss
6,959,996 B2 11/2005 Ip
6,969,946 B2 11/2005 Steranka et al.
6,972,439 B1 12/2005 Kim et al.
6,999,318 B2 2/2006 Newby
7,008,080 B2 3/2006 Bachl et al.
7,009,213 B2 3/2006 Camras et al.
7,019,334 B2 3/2006 Yatsuda et al.
7,036,961 B2 5/2006 Defouw et al.
7,045,965 B2 5/2006 Li et al.
7,055,987 B2 6/2006 Staufert
7,056,116 B2 6/2006 Scott et al.
7,063,451 B2 6/2006 Shen
7,078,258 B2 7/2006 Sakoh et al.
7,080,932 B2 7/2006 Keuper
7,081,645 B2 7/2006 Chen et al.
D526,972 S 8/2006 Egawa et al.
7,090,370 B2 8/2006 Clark et al.
7,102,185 B2 9/2006 Nichols et al.
7,114,830 B2 10/2006 Robertson et al.
7,141,825 B2 11/2006 Horio et al.
7,153,004 B2 12/2006 Galli
D536,816 S 2/2007 Mier-Langner et al.
D536,817 S 2/2007 Mier-Langner et al.
7,176,070 B2 2/2007 Lee et al.
7,178,941 B2 2/2007 Roberge et al.
7,182,480 B2 2/2007 Kan
D537,972 S 3/2007 Mier-Langner et al.
D537,973 S 3/2007 Mier-Langner et al.
D538,459 S 3/2007 Rose et al.
D538,961 S 3/2007 Mier-Langner et al.
D539,460 S 3/2007 Mier-Langner et al.
D539,956 S 4/2007 Rose et al.
7,199,529 B2 4/2007 Vernon-Dier
7,234,844 B2 6/2007 Bolta et al.
7,237,936 B1 7/2007 Gibson
7,244,042 B1 7/2007 Bieberdorf
D551,379 S 9/2007 Maxik
7,267,459 B2 9/2007 Matheson
7,269,009 B2 9/2007 Ryu et al.
7,273,987 B2 9/2007 Becker et al.
7,278,761 B2 10/2007 Kuan
7,281,818 B2 10/2007 You et al.
7,288,796 B2 10/2007 Dry
7,303,301 B2 12/2007 Koren et al.
D563,013 S 2/2008 Levine
7,329,030 B1 2/2008 Wang
7,329,033 B2 2/2008 Glovatsky et al.
D563,580 S 3/2008 Prazoff
D563,582 S 3/2008 Levine
D564,117 S 3/2008 Lippert
7,348,604 B2 3/2008 Matheson
D571,032 S 6/2008 Chen
7,434,959 B1 10/2008 Wang
7,434,964 B1 10/2008 Zheng et al.
7,461,952 B2 12/2008 Trenchardl et al.
7,488,090 B1 2/2009 Bucher et al.
7,503,669 B2 3/2009 Rizkin et al.
7,513,639 B2 4/2009 Wang
7,530,711 B2 5/2009 Bang
7,534,009 B2 5/2009 Trojanowski et al.
7,543,953 B2 6/2009 Chapman
7,549,774 B2 6/2009 Tsai
7,566,147 B2 7/2009 Wilcox et al.
7,569,802 B1 8/2009 Mullins
7,572,027 B2 8/2009 Zampini, II et al.
7,575,354 B2 8/2009 Woodward
D599,494 S 9/2009 Levine
7,591,567 B2 9/2009 Wilcox et al.
7,637,624 B2 12/2009 Chin
7,637,630 B2 12/2009 Wilcox et al.
7,637,633 B2 * 12/2009 Wong ............................ 362/294
7,654,691 B2 2/2010 Liu et al.
7,665,699 B2 2/2010 Oddsen, Jr. et al.
7,665,862 B2 2/2010 Villard
7,679,096 B1 3/2010 Ruffin
7,686,469 B2 3/2010 Ruud et al.
7,703,939 B2 4/2010 Wilcox et al.
7,744,236 B2 6/2010 Hsu et al.
7,744,247 B2 6/2010 Zhang et al.
7,758,211 B2 7/2010 Zheng et al.
7,771,087 B2 8/2010 Wilcox et al.
7,794,116 B2 9/2010 Shuai et al.
D626,264 S 10/2010 Liu
7,828,465 B2 11/2010 Roberge et al.
7,938,558 B2 5/2011 Wilcox et al.
7,952,262 B2 5/2011 Wilcox et al.
7,976,199 B2 7/2011 Berns et al.
8,021,026 B2 9/2011 Liu et al.
8,061,869 B2 11/2011 Lo
8,067,778 B2 11/2011 Bae et al.
8,070,306 B2 12/2011 Ruud et al.

(56) References Cited

U.S. PATENT DOCUMENTS

| | | | |
|---|---|---|---|
| 8,092,042 | B2 | 1/2012 | Wilcox |
| 8,092,049 | B2 | 1/2012 | Kinnune et al. |
| 8,104,933 | B2 | 1/2012 | Liu et al. |
| 8,313,221 | B2 | 11/2012 | Hsu |
| 8,313,222 | B2 | 11/2012 | Kinnune et al. |
| 8,353,606 | B2 | 1/2013 | Jeong |
| 8,393,764 | B2 | 3/2013 | Yao |
| D681,250 | S | 4/2013 | Ruffalo et al. |
| 8,425,071 | B2 | 4/2013 | Ruud et al. |
| 8,425,086 | B2 | 4/2013 | Chen et al. |
| 2002/0070386 | A1 | 6/2002 | Krames et al. |
| 2002/0171087 | A1 | 11/2002 | Krames et al. |
| 2003/0048608 | A1 | 3/2003 | Crocker et al. |
| 2003/0189829 | A1 | 10/2003 | Shimizu et al. |
| 2004/0036629 | A1 | 2/2004 | Jones et al. |
| 2004/0052077 | A1 | 3/2004 | Shih |
| 2004/0156209 | A1 | 8/2004 | Ishida |
| 2004/0161338 | A1 | 8/2004 | Hsieh |
| 2004/0174651 | A1 | 9/2004 | Aisenbrey |
| 2004/0175189 | A1 | 9/2004 | Weber-Rabsilber et al. |
| 2004/0212291 | A1 | 10/2004 | Keuper |
| 2004/0213016 | A1 | 10/2004 | Rice |
| 2004/0222516 | A1 | 11/2004 | Lin et al. |
| 2004/0251469 | A1 | 12/2004 | Yatsuda et al. |
| 2004/0257006 | A1 | 12/2004 | Beeman et al. |
| 2004/0257808 | A1 | 12/2004 | Bjornson et al. |
| 2004/0264195 | A1 | 12/2004 | Chang et al. |
| 2005/0023545 | A1 | 2/2005 | Camras et al. |
| 2005/0052378 | A1 | 3/2005 | Hacker |
| 2005/0057939 | A1 | 3/2005 | Mizuyoshi |
| 2005/0068765 | A1 | 3/2005 | Ertze Encinas et al. |
| 2005/0072558 | A1 | 4/2005 | Whitney et al. |
| 2005/0128752 | A1 | 6/2005 | Ewington et al. |
| 2005/0135093 | A1 | 6/2005 | Alexanderson et al. |
| 2005/0174762 | A1 | 8/2005 | Fogerlie |
| 2005/0190562 | A1 | 9/2005 | Keuper et al. |
| 2005/0213328 | A1 | 9/2005 | Matheson |
| 2005/0224826 | A1 | 10/2005 | Keuper et al. |
| 2005/0258446 | A1 | 11/2005 | Raos et al. |
| 2005/0274959 | A1 | 12/2005 | Kim et al. |
| 2005/0281033 | A1 | 12/2005 | Coushaine et al. |
| 2006/0018099 | A1 | 1/2006 | Chen |
| 2006/0056169 | A1 | 3/2006 | Lodhie et al. |
| 2006/0061967 | A1 | 3/2006 | Kim et al. |
| 2006/0097385 | A1 | 5/2006 | Negley |
| 2006/0105482 | A1 | 5/2006 | Alferink et al. |
| 2006/0131757 | A1 | 6/2006 | Yu et al. |
| 2006/0138645 | A1 | 6/2006 | Ng et al. |
| 2006/0138951 | A1 | 6/2006 | Tain et al. |
| 2006/0141851 | A1 | 6/2006 | Matsui et al. |
| 2006/0146531 | A1 | 7/2006 | Reo et al. |
| 2006/0158080 | A1 | 7/2006 | Nakano et al. |
| 2006/0169878 | A1 | 8/2006 | Kasano et al. |
| 2006/0175626 | A1 | 8/2006 | Wall, Jr. |
| 2006/0176686 | A1 | 8/2006 | McVicker |
| 2006/0181878 | A1 | 8/2006 | Burkholder |
| 2006/0187671 | A1 | 8/2006 | Coushaine et al. |
| 2006/0193139 | A1 | 8/2006 | Sun et al. |
| 2006/0250803 | A1 | 11/2006 | Chen |
| 2007/0019415 | A1 | 1/2007 | Leblanc et al. |
| 2007/0070625 | A1 | 3/2007 | Bang |
| 2007/0086196 | A1 | 4/2007 | Wong |
| 2007/0097684 | A1 | 5/2007 | Obara et al. |
| 2007/0098334 | A1 | 5/2007 | Chen |
| 2007/0115666 | A1 | 5/2007 | Thomas et al. |
| 2007/0159827 | A1 | 7/2007 | Huang |
| 2007/0258214 | A1 | 11/2007 | Shen |
| 2008/0002399 | A1 | 1/2008 | Villard et al. |
| 2008/0019129 | A1 | 1/2008 | Wang |
| 2008/0037239 | A1 | 2/2008 | Thomas et al. |
| 2008/0043473 | A1 | 2/2008 | Matsui |
| 2008/0055908 | A1 | 3/2008 | Wu et al. |
| 2008/0068799 | A1 | 3/2008 | Chan |
| 2008/0080162 | A1 | 4/2008 | Wilcox et al. |
| 2008/0080188 | A1 | 4/2008 | Wang |
| 2008/0080189 | A1 | 4/2008 | Wang |
| 2008/0080196 | A1 | 4/2008 | Ruud et al. |
| 2008/0089071 | A1 | 4/2008 | Wang |
| 2009/0034261 | A1 | 2/2009 | Grove |
| 2009/0180281 | A1 | 7/2009 | Ahland, III et al. |
| 2009/0244895 | A1 | 10/2009 | Chen |
| 2009/0251898 | A1 | 10/2009 | Kinnune et al. |
| 2009/0268477 | A1 | 10/2009 | Zheng et al. |
| 2009/0296403 | A1 | 12/2009 | Zhang et al. |
| 2010/0026158 | A1 | 2/2010 | Wu |
| 2010/0039013 | A1 | 2/2010 | Tsai |
| 2010/0046223 | A1 | 2/2010 | Li et al. |
| 2010/0149809 | A1 | 6/2010 | Ruud et al. |
| 2010/0195323 | A1 | 8/2010 | Schaefer et al. |
| 2010/0238671 | A1 | 9/2010 | Catone et al. |
| 2010/0314985 | A1 | 12/2010 | Premysler |
| 2011/0013397 | A1 | 1/2011 | Catone et al. |
| 2011/0089830 | A1 | 4/2011 | Pickard et al. |
| 2011/0095690 | A1 | 4/2011 | Sagal |
| 2011/0188233 | A1 | 8/2011 | Josefowicz et al. |
| 2011/0222284 | A1 | 9/2011 | Kong et al. |
| 2011/0299280 | A1 | 12/2011 | Maeers |
| 2012/0025711 | A1 | 2/2012 | Best et al. |
| 2012/0057351 | A1 | 3/2012 | Wilcox et al. |
| 2012/0281404 | A1 | 11/2012 | Wilcox et al. |
| 2012/0307496 | A1 | 12/2012 | Phillips, III et al. |
| 2014/0049961 | A1 | 2/2014 | Wilcox et al. |

FOREIGN PATENT DOCUMENTS

| | | | |
|---|---|---|---|
| CN | 101093073 | A | 12/2007 |
| CN | 101101102 | A | 1/2008 |
| CN | 101101103 | A | 1/2008 |
| CN | 101101104 | A | 1/2008 |
| CN | 101101106 | A | 1/2008 |
| CN | 101101107 | A | 1/2008 |
| CN | 101105268 | A | 1/2008 |
| CN | 101105278 | A | 1/2008 |
| DE | 9417326 | U1 | 2/1995 |
| DE | 10110835 | A1 | 3/2001 |
| DE | 202006015981 | U1 | 10/2006 |
| DE | 2020006010949 | U1 | 10/2006 |
| EP | 1431653 | A2 | 6/2004 |
| EP | 1760393 | A1 | 3/2007 |
| EP | 1906081 | A1 | 4/2008 |
| FR | 2818786 | A1 | 6/2002 |
| GB | 2201042 | A | 8/1988 |
| JP | 59229844 | A | 12/1984 |
| JP | 10268800 | A | 10/1998 |
| JP | 2000183406 | A | 6/2000 |
| JP | 2005109228 | | 4/2005 |
| JP | 2007134190 | | 5/2007 |
| NL | 1026514 | | 6/2004 |
| WO | WO9833007 | A1 | 7/1998 |
| WO | WO9957945 | A1 | 11/1999 |
| WO | WO0125683 | A1 | 12/2001 |
| WO | WO0216826 | A1 | 2/2002 |
| WO | WO03089841 | A1 | 10/2003 |
| WO | WO2004079256 | A1 | 9/2004 |
| WO | WO2006049086 | A1 | 5/2006 |
| WO | WO2006060905 | A1 | 6/2006 |
| WO | WO2007000037 | A1 | 1/2007 |

OTHER PUBLICATIONS

Kramer Lighting, Sturtevant, WI. Excerpts from Kramer Lighting brochure. Metal Halide Cylinder Downlightt specification. Copyright 2010.

Affineon Lighting, Coral Springs, FL. Excerpts from Affineon Lighting. DL Downlight specification. Copyright 2009.

Affineon Lighting, Coral Springs, FL. Excerpts from Affineon Lighting. DLM Mini Downlight specification. Copyright 2008.

Tarricone, Paul. "Coming Soon to Broadway." www.jesna.org. Date: Feb. 2005.

Excerpt from www.ledsmagazine.com. "LED design wins New York city streetlight competition." Date: Dec. 2004.

"Professional Lighting Design." No. 40 Date: Nov./Dec. 2005.

The Lighting Journal. "LED Street Lighting." Date: Jul./Aug. 2006.

(56) References Cited

OTHER PUBLICATIONS

Excerpt from enLux Lighting. www.enluxled.com. "enLux 6K Series LED Outdoor Area Light." Date: undated.
Excerpt from enLux Lighting. www.enluxled.com. "enLux 6K Series LED Theatrical Area Light." Date: undated.
Excerpt from enLux Lighting. www.enluxled.com. "enLux 1K LED Light Bar Module." Date: undated.
Alpha One GmbH. "Falcon flood—LED." Date: undated.
Alpha One GmbH. "Savi Architectural LED Lighting" technical specification. Date: undated.
Excerpt from Supervision International website. www.svision.com. "SaVi SHO." Date: Copyright 2006.
Excerpt from Supervision International website. www.svision.com. "SaVi SHO" technical specification. Date: undated.
Leotek brochure. "LED Outdoor Luminaire & Light Fixtures." Date: undated.
In Reexamination of Pat. No. 8,070,306, PTO Action. Date: May 7, 2012.
In Reexamination of Pat. No. 8,070,306, response and supporting documents to May 7, 2012 PTO Action. Date: Jul. 9, 2012.
Images from Cooper Lighting's Motion for Leave. Date: 2004.
Images from Cooper Lighting's Motion for Leave. Date: 2005.
Images from Cooper Lighting's Motion for Leave. Date: 2006.
Philips Lumec, Roadster Series brochure. Date: 2009. 26 pages. Philips Group, Lumec Head Office, 640 Cure-Boivin Boulevard, Boisbriand, Quebec, Canada J7G 2A7.
Philips Lumec, Roadster Luminaire brochure. 43 pages.
Philips Roadway Lighting. Product Brochure. Date: Copyright 2010. 12 pages.
Light News. Date: Nov. 2010. 8 pages. Electron AG, Bereich Lichttechnik, Riedhofstrasse 11, CH-8804 Au ZH.
Future Lighting Solutions brochure. "The 6 Steps to LED Lighting Success." 6 pages. Date: undated.
Excerpt from Aavid Thermalloy (www.aavidthermalloy.com) "LED Light Sources." 1 page. Date: Copyright 2006.
Aavid Thermal Technologies, Inc. article. "How to Select a Heat Sink." 5 pages. Date: undated.
Excerpt from Mouser Electronics (www.mouser.com). Product List. 1 page. Date: Aug. 16, 2006.
Excerpt from Lumileds Future Electronics (www.lumiledsfuture.com) "Thermal Solutions." 1 page. Date: Jul. 14, 2006.
Excerpt from National Northeast Corporation brochure. "Miscellaneous Shape Heat Sinks." 2 pages. Date: undated.
Excerpt from Aavid Thermalloy (www.aavidthermalloy.com). Part Specification. 3 pages. Date: Copyright 2006.
Excerpt from Therma-Flo brochure. 8 pages. Date: Copyright 2002.
Excerpt from Aavrd Thermalloy (www.aavidthermalloy.com,) "Product Offerings." 2 pages. Date: Copyright 2006.
Excerpt from ThermaFlo (www.thermalloy.com). "Bonded Fin Heat Sinks." 1 page. Date: Aug. 24, 2006.
Excerpt from ThermaFlo (www.thermaflow.com). "Folded Fin Heat Sinks." 2 pages. Date: Aug. 24, 2006.
Excerpt from ThermaFlo (www.thermaflow.com). "High Power Heat Sinks." 2 pages. Date: Aug. 24, 2006.
National Northwest Corporation brochure. "Flat Back Shape Heat Sinks III." 12 pages. Date: undated.
Excerpt from Wakefield Thermal Solutions (www.wakefield.com). "Thermal Extrusions." 1 page. Date: Aug. 16, 2006.
Wakefield Thermal Solutions brochure. "Quality Aluminum Extrusion and Fabrication." 4 pages. Date: undated.
Stanley Electric co., Ltd. "Stanley LED for Street Light Brochure." 8 pages. date: Aug. 2006.
Excerpt from Aavid Thermalloy (www.aavidthermalloy.com). Part Specification. 1 page. Date: Copyright 2006.

* cited by examiner

FIG. 3
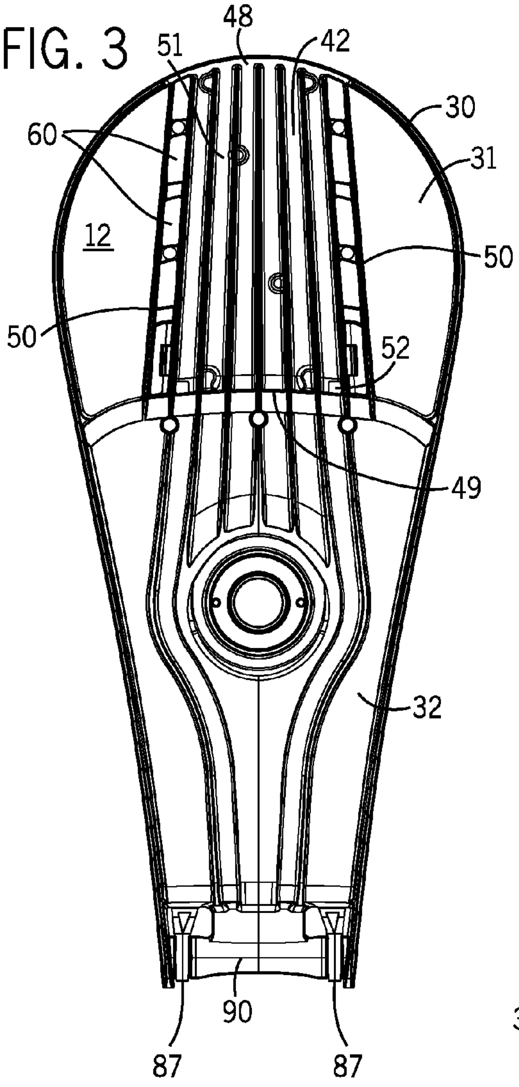
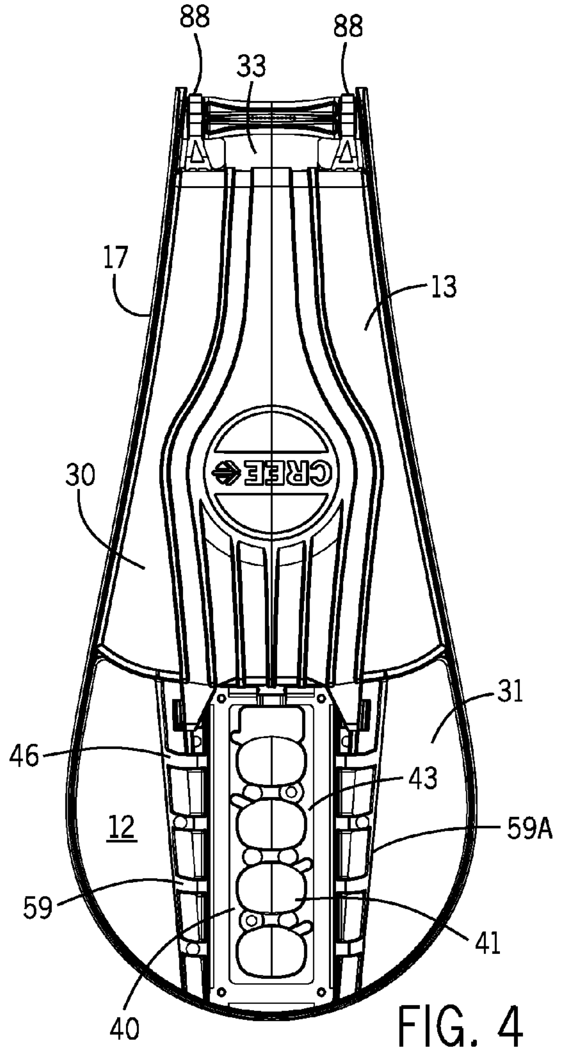
FIG. 4

LED LIGHT FIXTURE

RELATED APPLICATION

This application is a continuation-in-part of patent application Ser. No. 13/764,743, filed Feb. 11, 2013. This application is also a continuation-in-part of patent application Ser. No. 13/834,525, filed Mar. 15, 2013, which is a continuation of patent application Ser. No. 13/294,459, filed Nov. 11, 2011, now U.S. Pat. No. 8,425,071, issued Apr. 23, 2013, which is a continuation of patent application Ser. No. 12/629,986, filed Dec. 3, 2009, now U.S. Pat. No. 8,070,306, issued Dec. 6, 2011, which is a continuation of patent application Ser. No. 11/860,887, filed Sep. 25, 2007, now U.S. Pat. No. 7,686,469, issued Mar. 30, 2010, which is a continuation-in-part of now abandoned patent application Ser. No. 11/541,908, filed Sep. 30, 2006. This application is also a continuation-in-part of patent application Ser. Nos. 13/764,736 and 13/764,746, each filed Feb. 11, 2013. And, this application also a continuation-in-part of patent application Ser. No. 13/839,922, filed Mar. 15, 2013, which is based on U.S. Provisional Application Ser. No. 61/624,211, filed Apr. 13, 2012, and which is a continuation-in-part of patent application Ser. No. 13/680,481, filed Nov. 19, 2012, now U.S. Pat. No. 8,622,584, issued Jan. 7, 2014, which in turn is a continuation of patent application Ser. No. 13/333,198, filed Dec. 21, 2011, now U.S. Pat. No. 8,313,222, issued Nov. 20, 2012, which in turn is a continuation of patent application Ser. No. 12/418,364, filed Apr. 3, 2009, now U.S. Pat. No. 8,092,049, issued Jan. 10, 2012, which in turn is based in part on U.S. Provisional Application Ser. No. 61/042,690, filed Apr. 4, 2008.

The contents of each of application Ser. Nos. 13/764,743, 13/834,525, 13/294,459, 12/629,986, 11/860,887, 11/541,908, 13/764,736, 13/764,746, 13/839,922, 61/624,211, 13/680,481, 13/333,198, 12/418,364 and 61/042,690 are incorporated herein by reference in their entirety.

FIELD OF THE INVENTION

This invention relates to light fixtures and, more particularly, to light fixtures using light-emitting diodes (LEDs).

BACKGROUND OF THE INVENTION

In recent years, the use of light-emitting diodes (LEDs) in development of light fixtures for various common lighting purposes has increased, and this trend has accelerated as advances have been made in the field. Indeed, lighting applications which previously had typically been served by fixtures using what are known as high-intensity discharge (HID) lamps are now being served by LED light fixtures. Such lighting applications include, among a good many others, roadway lighting, factory lighting, parking lot lighting, and commercial building lighting.

High-luminance light fixtures using LED modules as light source present particularly challenging problems. One particularly challenging problem for high-luminance LED light fixtures relates to heat dissipation. Among the advances in the field are the inventions of U.S. Pat. Nos. 7,686,469 and 8,070,306.

Improvement in dissipating heat to the atmosphere is one significant objective in the field of LED light fixtures. It is of importance for various reasons, one of which relates to extending the useful life of the lighting products. Achieving improvements without expensive additional structure and apparatus is much desired. This is because a major consideration in the development of high-luminance LED light fixtures for various high-volume applications, such as roadway lighting, is controlling product cost even while delivering improved light-fixture performance.

In summary, finding ways to significantly improve the dissipation of heat to the atmosphere from LED light fixtures would be much desired, particularly in a fixture that is easy and inexpensive to manufacture.

SUMMARY OF THE INVENTION

The present invention relates to improved LED light fixtures. In certain embodiments, the inventive LED light fixture includes a housing portion and an LED-supporting heat sink open for air/water-flow thereover. The housing portion and the heat sink may define a venting gap therebetween permitting air/water-flow to and from the LED-supporting heat sink. An LED illuminator ma be secured with respect to the LED-supporting region of the heat sink.

In some embodiments, the housing portion includes a substantially closed chamber enclosing at least one electronic LED driver. The heat sink includes an LED-supporting region and heat-dissipating surfaces extending therefrom. In certain embodiments, the heat sink has front, rear and lateral sides and is open to ambient-fluid flow to and from the heat-dissipating surfaces along each of the sides.

The heat sink includes central and peripheral portions. In some embodiments, the central portion include the LED-supporting region and having central heat-dissipating surfaces opposite the LED illuminator. The peripheral portion has peripheral heat-dissipating surfaces along the lateral sides of the heat sink.

In certain embodiments, the venting gap includes at least one central-portion venting aperture partially defined by the housing portion and facilitating ambient-fluid flow to and from the central heat-dissipating surfaces.

The central portion of the heat sink may have a plurality of elongate fins protruding in a direction opposite the LED illuminator and extending from distal fin-ends adjacent to the front side of the heat sink to proximal fin-ends adjacent to the rear side of the heat sink. In some of such embodiments, at least one of the proximal fin-ends is secured to the housing portion.

The fins may define horizontal between-fin channels open at the distal fin-ends. The proximal fin-ends may be configured to permit ambient-fluid flow from the between-fin channels to the at least one central-portion aperture, thereby to facilitate liquid drainage therefrom.

In some embodiments, each of the peripheral portions has at least one peripheral fin along the heat sink, the peripheral fin(s) extending from distal fin-ends adjacent to the front side of the heat sink to proximal fin-ends adjacent to the rear side of the heat sink.

In certain embodiments, the inventive LED light fixture includes a frame defining a forward region and a rearward region. The rearward region may have an enclosure and a rearmost portion. The enclosure may define a chamber enclosing electronic LED power circuitry. The rearmost portion may be adapted for securement to a support member.

In some embodiments, the forward region has a heat sink and open spaces within the frame on either side of the heat sink, the heat sink comprising an LED-supporting region and heat-dissipating surfaces extending therefrom. In such embodiments, the LED illuminator is secured with respect to the LED-supporting region. The heat sink and the frame may be formed as a single piece.

The enclosure may have upper and lower shells. The upper shell and the frame may be formed as a single piece. And, the lower shell may be movably secured with respect to the upper shell.

The central portion may have a plurality of fins protruding in a direction opposite the LED illuminator. In some embodiments, the heat sink includes at least one central-portion venting aperture adjacent to the enclosure and facilitating ambient-fluid flow to and from the heat-dissipating surfaces of the central portion. The central-portion venting aperture may be partially defined by the enclosure.

In certain embodiments of the inventive LED light fixture which in plan view comprises central and outward portions, the central portion may have an enclosure with LED power circuitry therein, a heat sink secured with respect to the enclosure and supporting an LED illuminator, and a mount adapted for securement to a support member. The outward portion may define an outer plan-view shape of the fixture and being secured to the central portion with through-space(s) between the central and outward portions. In some embodiments, the outward portion has an outer perimeter which in plan view is substantially similar to the footprint of a cobrahead non-LED light fixture.

In some of such embodiments the through-space(s) is/are at least along the heat sink. The through-space(s) along the heat sink may be on opposite sides thereof. There may be at least two through-space(s), including at least one on each of the opposite sides of the heat sink.

In certain embodiments, the LED illuminator includes at least one LED emitter and an optical member over at least one LED emitter for illumination therebelow. In some of such embodiments, the at least one LED emitter is in thermal connection with the heat sink which has downwardly-extending shield members at the lateral sides thereof configured and dimensioned to block illumination.

The optical member may be configured for directing emitter light predominantly toward the forward side. The central heat-sink portion may have a downwardly-extending rearward shield member at the rearward side of the central heat-sink configured and dimensioned to block rearward illumination. In some of such embodiments. The rearward shield member extends to a position lower than a lowermost outer-surface portion of the optical member.

In certain embodiments, the housing includes a main portion having a forward wall-portion with the heat sink extending forwardly therefrom. The forward wall-portion of the housing may at least partially define the rearward shield member.

In some of such embodiments, the main portion of the housing includes a housing body and a cover member movably secured with respect to the housing body, the housing body and the cover member forming a substantially closed chamber. The housing body may include the forward wall-portion.

The cover member may have a forward end secured to the forward wall-portion of the housing body and at least partially defining the rearward shield member. The cover member may also have a rearward end opposite the forward end and a cover wall extending therebetween. The cover wall may include a lowermost portion which is at a position lower than the lowermost position of the rearward shield member to further block rearward illumination.

In certain embodiments of the fixture including the frame with the open forward region and a rearward region, the heat sink may be positioned within the forward region and secured with respect to the frame with open spaces remaining therebetween. In some of such embodiments, the frame and the main portion of the housing are formed as a single piece. The heat sink and the frame may be formed as a single piece.

The housing may includes a forward portion extending from the main portion of the housing and defining the forward region, the forward portion having outer lateral edges. In some of such embodiments, open spaces may be defined between the lateral sides of the heat sink and the outer lateral edges of the forward portion of the housing, whereby the lateral shield members block lateral light from reflection by the forward portion of the housing.

In certain other embodiments, the inventive LED light fixture includes a housing and an LED assembly secured with respect thereto. The LED assembly includes an LED illuminator secured with respect to an LED-supporting region of a heat sink with heat-dissipating surfaces extending therefrom. The heat sink has front, rear and lateral sides and is open to ambient-fluid flow to and from the heat-dissipating surfaces along each of the sides. The heat sink defines openings open to ambient-fluid flow to and from the heat-dissipating surfaces. Such openings are along at least two of the sides of the heat sink which are transverse to one another. In some embodiments, the openings are along the two lateral sides and the rear side. The housing and the heat sink may be formed as one piece.

In certain embodiments, the heat sink includes central and peripheral portions. The central portion includes the LED-supporting region and has central heat-dissipating surfaces opposite the LED illuminator. The peripheral portion has peripheral heat-dissipating surfaces along the lateral sides of the heat sink.

In some of such embodiments, the openings include at least one central-portion venting aperture facilitating ambient-fluid flow to and from the central heat-dissipating surfaces. The central-portion venting aperture may be adjacent to and partially defined by the housing.

In some embodiments, the central portion includes a plurality of elongate fins protruding from a heat-sink surface which is opposite the LED illuminator. The elongate fins protrude in a direction opposite the LED illuminator and in their lengths extend from distal fin-ends adjacent to the front side of the heat sink to proximal fin-ends adjacent to the rear side of the heat sink. At least one of the proximal fin-ends may be secured to the housing.

In certain of such embodiments, the fins define horizontal between-fin channels open at the distal fin-ends. The proximal fin-ends are configured to permit ambient-fluid flow from the between-fin channels to the at least one central-portion aperture, thereby to facilitate liquid drainage therefrom. The central portion has between-fin surfaces (i.e., the channel bottoms) which may be inclined off-horizontal in the mounted position, thereby to further facilitate liquid drainage from the heat sink.

In certain embodiments, when the fixture is in its mounted orientation, the surface which is opposite the LED illuminator, in particular the surface including the channel bottoms, slopes toward at least two of the sides (e.g., four sides) of the heat sink, thereby to facilitate liquid drainage from the heat sink. In some embodiments, the surface slopes toward at least three of the sides of the heat sink; and in some the surface slopes toward each of the sides of the heat sink.

In some embodiments, the LED assembly is on a bottom surface of the heat sink. The heat sink, when the fixture is in its mounted orientation, includes a top surface which in plan view has a surrounding edge. In some embodiments, the top surface slops downwardly toward the surrounding edge in at least two of the forward, rearward and opposite lateral plan-view directions, thereby to facilitate liquid drainage from the heat sink.

In some embodiments, the top surface slopes toward the at least three of the forward, rearward and opposite lateral plan-view directions. In some of such embodiments, the top surface slopes toward the at least three of the forward, rearward and opposite lateral plan-view directions. In some embodiments, the top surface slopes toward each of such plan-view directions.

In certain of such embodiments, through-openings are formed in the fixture for ambient fluid flow to and from the heat sink. In some of such embodiments, the heat sink defines the through-openings.

In some embodiments, the fixture includes at least one central-portion venting aperture facilitating ambient-fluid flow to and from the top surface. In the embodiments including a housing with the LED assembly secured with respect thereto, the central-portion venting aperture may be at least partially defined by the housing.

In the embodiments where the central portion of the heat sink has a plurality of elongate fins protruding from the top surface in a direction opposite the LED illuminator, the sloping top surface includes between-fin surfaces.

In some of such embodiments, the frame and the heat sink are formed as one piece.

In certain embodiments, the housing includes a housing top surface sloping downwardly in at least two of the forward, rearward and opposite lateral plan-view directions, thereby to facilitate liquid drainage therefrom. The top housing surface may be of a housing upper shell. In some embodiments, the housing upper shell and heat sink are formed as a single piece, whereby the housing upper shell facilitates heat dissipation.

In certain embodiments, the top housing surface slopes toward the top surface of the heat sink, whereby liquid drainage from the housing facilitates cooling of the heat sink.

In some embodiments, the heat sink, the frame and the housing upper shell are formed as a single piece.

The peripheral portion of the heat sink, mentioned above, may also have at least one peripheral-portion opening therethrough along the two lateral sides of the heat sink. These peripheral-portion openings facilitate ambient-fluid flow to and from the peripheral heat-dissipating surfaces. In some of such embodiments, the peripheral portion has at least one peripheral fin along each lateral side of the heat sink. The peripheral fins extends from distal fin-ends adjacent to the front side of the heat sink to proximal fin-ends adjacent to the rear side of the heat sink. In some embodiments, the proximal fin-ends of the peripheral fins is secured to the housing.

The at least one peripheral-portion opening may include at least a pair or as many as several openings between the respective peripheral fin and the central portion of the heat sink. In some embodiments, the peripheral-portion openings are elongate in spaced substantially end-to-end relationship with heat-sink structure extending (laterally from the central portion of the heat sink to the respective peripheral fin) between each adjacent pair of such openings. In some embodiments, the combined length of the openings along each of the respective peripheral fins constitutes a majority of the length of such fin.

In some embodiments, the peripheral heat-dissipating surfaces comprise a plurality of fins extending laterally from the central portion of the heat sink with open spaces between such fins. The central portion may also have a plurality of fins extending forwardly from the central portion of the heat sink with open spaces between the fins.

In some of such embodiments, the heat sink may be an extrusion which has been extruded in a direction orthogonal to both the forward and lateral directions, the extruded dimension of the heat sink being substantially less than the forward-rearward and side-to-side dimensions of the heat sink. In some versions of the extruded heat sink, the central portion of the extrusion includes walls defining a central opening (a void) in the extrusion; and in certain of such versions, in addition to the extrusion, the heat sink includes a mounting plate in thermal contact with the extrusion. In such versions, the LED illuminator is secured to the mounting plate portion of the heat sink.

The LED illuminator may include an LED emitter on a circuit board and an LED optical member over the emitter. The LED emitter may have an array of LED light sources spaced along the circuit board. The LED optical member may have a plurality of lenses each over a corresponding one of the LED light sources. Each LED light source may include an array of LEDs.

In accordance with certain aspects of the present invention, alternative embodiments of the LED lighting system can comprise one or more of the following aspects. In some embodiments, the frame comprises a central portion (which may also be referred to as a core or spine) which has an integral heat sink, at least a portion of the housing that comprises at least one compartment for wiring and/or driver circuitry separate from the LED illuminator, and a mount. The frame further comprises a peripheral portion spaced from the central portion to provide a desired form factor, e.g., such as a cobrahead or other form factor, and/or additional heat sinking. In some embodiments, the core has a plurality of compartments, where in some embodiments, at least one of the compartments provides isolation from the LED illuminator. In some embodiments, the heat sink is integrated with a compartment, for example, a heat sink surface can form a compartment wall. In some embodiments, the heat sink can form an integral backlight shield. In other embodiments, the heat sink can comprise a reflective backlight shield. In some embodiments, the core is formed from a single piece of die-cast metal. In some embodiments, the core comprises the top portion of the housing, and a compartment door of metal or a polymeric material provides access, such as 180 degree access, to the compartment(s) in the housing. In some embodiments the heat sink can comprise an extruded part with lateral fins.

In some embodiment, the central portion is integrated with the heatsink, supports the housing and provides mounting to a support member. A top and/or bottom enclosure(s), which can be in the form of a clamshell, engages the core to house electronic components of LED power circuitry.

In some embodiments, the top and/or bottom enclosure can form the peripheral portion of the frame and provide a desired form factor. The top and/or bottom enclosures can be made of metal and/or a polymeric material. In certain embodiments, by using a polymeric material, such as a plastic, nylon or polycarbonate, for the enclosure(s) or doors, the fixture may be able to integrate a fully-enclosed antenna for wireless control of the fixture and be able to provide electrical isolation that allows the use of a removable LED driver. One example of such removable driver is a caseless driver board which is fully encapsulated in a protective polymeric material providing electrostatic discharge (ESD) protection to the driver board which conducting heat away from the driver board during operation.

In some embodiments, the heat sink includes fins in the space between the heat sink and peripheral portions of the frame. In some embodiments, at least one thermal connection is provided between the heatsink and the peripheral portion of the frame in a space between the heat sink and the peripheral portion of the frame. In some embodiments, open through-spaces are provided on multiple axes, e.g., at least one on a side and at least one on the front or back.

In some embodiments, the core can be made at least in part of a polymeric material. In some embodiments, a polymeric mounting arrangement can be used to mount the lighting fixture to a pole. In some embodiments, the entire core is made of a polymeric material.

In some embodiments, a mounting arrangement is provided with an outside fulcrum which allows for a smaller aperture off the back and better clearance for the pole. In some embodiments, the fixture includes a fulcrum outside a fixture interior which provides advantages such as allowing a smaller aperture for a support-member entry into the fixture interior as well as easier access to the interior by providing more room for clearance of a compartment door has more clearance.

The smaller entry aperture may eliminate the need for a splash guard which is typically required for UL listed outdoor light fixtures, while still providing for the possibility of a splash-guard arrangements.

In some embodiment, the enclosure(s), door and/or housing can be molded and can comprise an integral backlight shield or reflector.

The term "ambient fluid" as used herein means air and/or water around and coming into contact with the light fixture.

The term "projected," as used with respect to various portion and areas of the fixture, refers to such portions and areas of the fixture in plan views.

As used herein in referring to portions of the devices of this invention, the terms "upward," "upwardly," "upper," "downward," "downwardly," "lower," "upper," "top," "bottom" and other like terms assume that the light fixture is in its usual position of use.

In descriptions of this invention, including in the claims below, the terms "comprising," "including" and "having" (each in their various forms) and the term "with" are each to be understood as being open-ended, rather than limiting, terms.

BRIEF DESCRIPTION OF THE DRAWINGS

FIG. 3 is a top plan view of the LED light fixture of FIG. 1.

FIG. 4 is a bottom plan view of the LED light fixture of FIG. 1.

FIGS. 38A-40A are bottom plan views of yet other alternative embodiments of the invention.

DETAILED DESCRIPTION OF EXEMPLARY EMBODIMENTS

Figure 1:
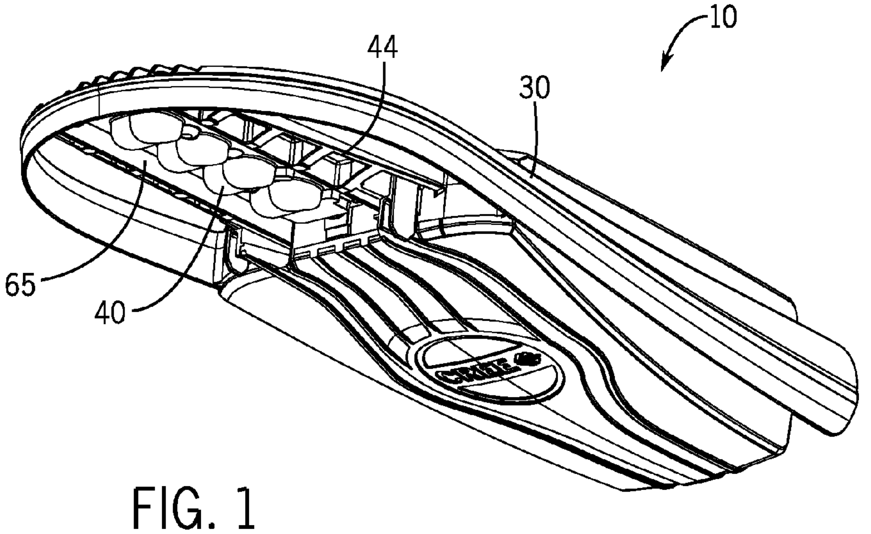
FIG. 1 is a perspective view from below of one embodiment of an LED light fixture in accordance with this invention.

The figures illustrate exemplary embodiments of LED light fixtures in accordance with this invention. Common or similar parts in different embodiments are given the same numbers in the drawings; the light fixtures themselves are often referred to by the numeral 10 followed by different letters with respect to alternative embodiments.

FIGS. 1-19, 32-33 and 35-37 illustrate a light fixture 10 which is a first embodiment in accordance with this invention. Light fixture 10 includes a frame 30 and an LED assembly 40 secured with respect to frame 30. Frame 30 surrounds and defines a forward open region 31 and a rearward region 32. Rearward region has a rearmost portion 33 adapted for securement to a support member 11. LED assembly 40 is positioned within open forward region 31 with open spaces 12 remaining therebetween—e.g., between either side of frame 30 and LED assembly 40. Other embodiments are possible where there are additional open spaces or one single open space.

Figure 5:
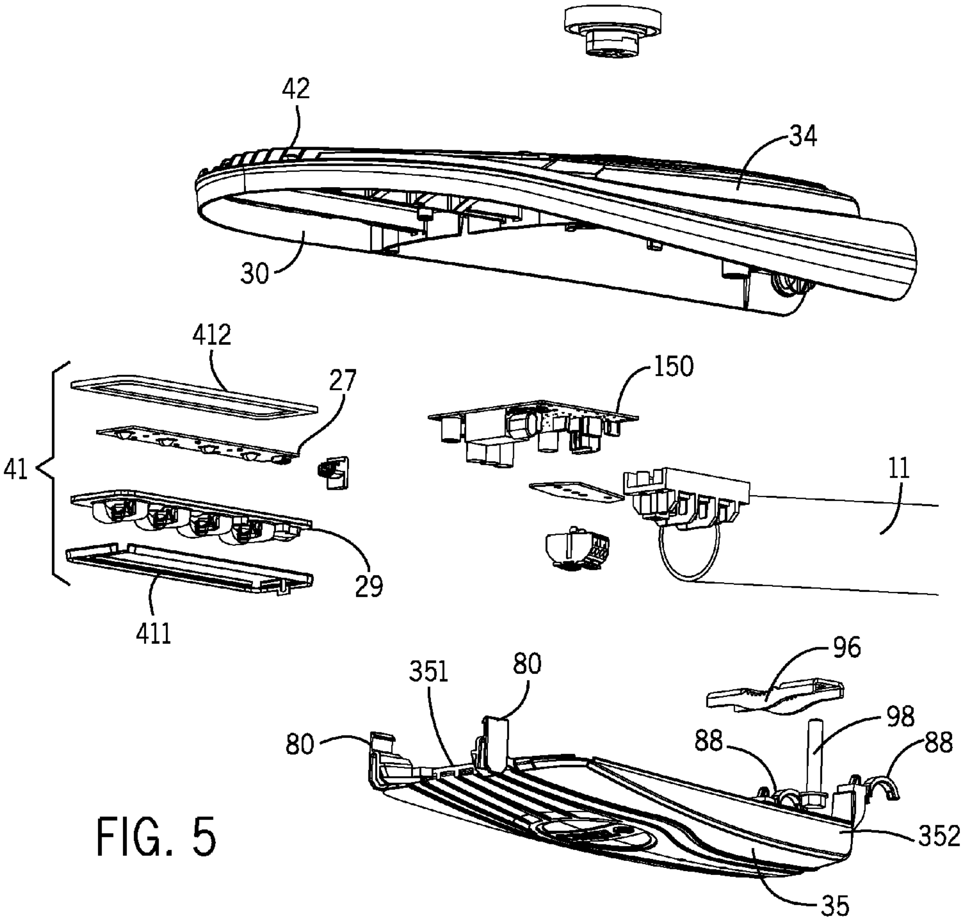
FIG. 5 is an exploded perspective view of the LED lighting of FIG. 1.

LED assembly 40 includes a heat sink 42 and an LED illuminator 41 secured with respect to heat sink 42. Heat sink 42 includes an LED-supporting region 43 with heat-dissipating surfaces 44 extending from LED-supporting region 43. LED illuminator 41 is secured with respect to LED-supporting region 43. As shown in FIG. 5, LED illuminator 41 includes a circuit board 27 with LED emitters 20 thereon and an optical member 29 over LED emitters 20 for illumination of areas below light fixture 10 (when fixture 10 is mounted in its usual use orientation).

FIGS. 27-31 show LED emitters in different forms among those usable in the present invention. Each LED emitter includes one or more light-emitting diodes (LED) 22 with a primary lens 24 thereover, forming what is referred to as LED package.

Figure 27:
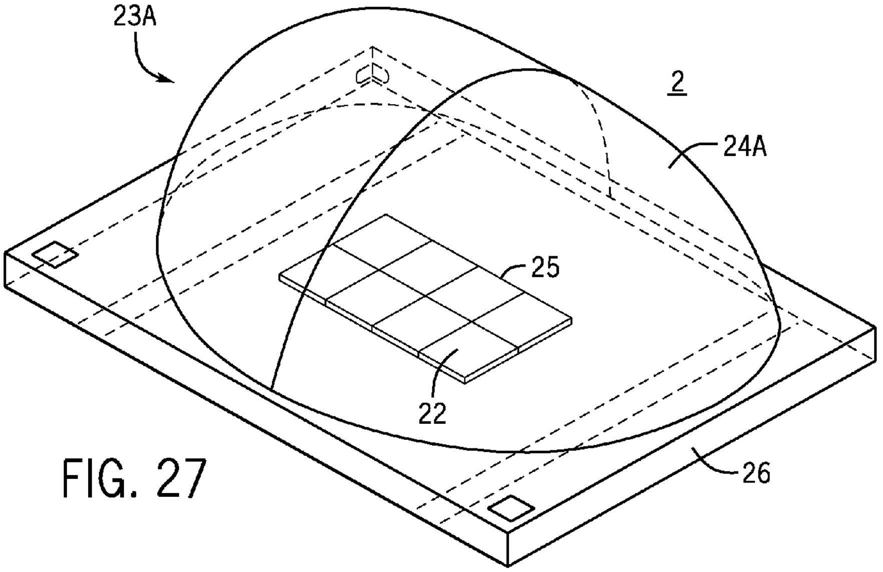
FIGS. 27 and 28 are enlarged perspective views of two examples of LED packages usable in LED light fixtures of this invention, the LED packages including different arrays of LEDs on a submount with an asymmetric primary lens overmolded on the LED arrays.
Figure 28:
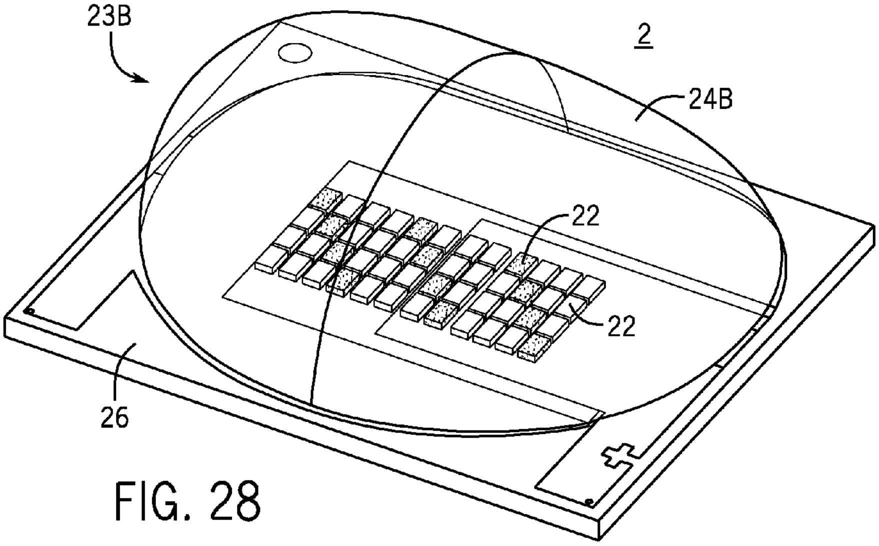

FIGS. 27 and 28 illustrate exemplary LED packages 23A and 23B each including an array of LEDs 22 on an LED-populated area 25 which has an aspect ratio greater than 1, and primary lenses 24 being overmolded on a submount 26 over LED-populated area 25. It is seen in FIG. 28 that the array may include LEDs 22 emitting different-wavelength light of different colors such as including red LEDs along with light green or other colors to achieve natural white light. Light emitters of the type as LED packages 23A and 23B are described in detail in patent application Ser. No. 13/441,558, filed on Apr. 6, 2012, and in patent application Ser. No. 13/441,620, filed on Apr. 6, 2012. Contents of both applications are incorporated herein by reference in their entirety.

FIGS. 27 and 28 also illustrate versions of LED light emitters configured to refract LED-emitted light toward a preferential direction 2. In each LED package 23A and 23B, each LED array defines emitter axis. FIGS. 27 and 28 illustrate primary lens 24A configured to refract LED-emitted light toward preferential side 2. It should be understood that for higher efficiency LED emitter may have a primary lens having its centerline offset from the emitter axis and also being shaped for refraction of LED-emitted light toward preferential side 2. In FIGS. 27 and 28, primary lens 24A is asymmetric.

Figure 29:
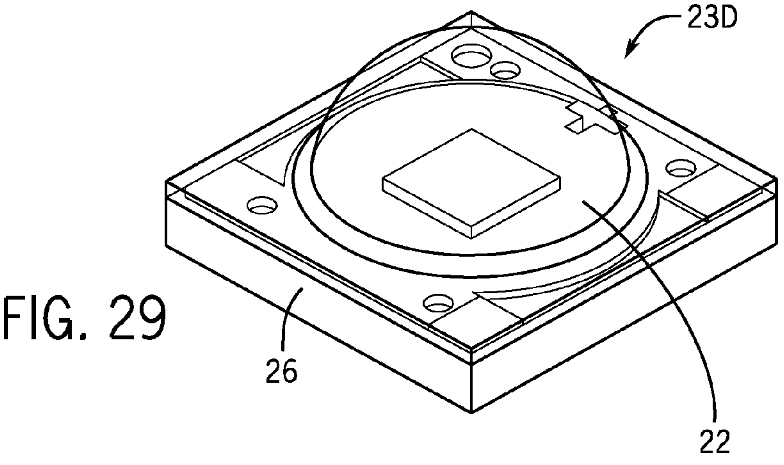
FIG. 29 is an enlarged perspective of yet another example of an LED package which has a single LED on a submount with an overmolded hemispheric primary lens.
Figure 30:
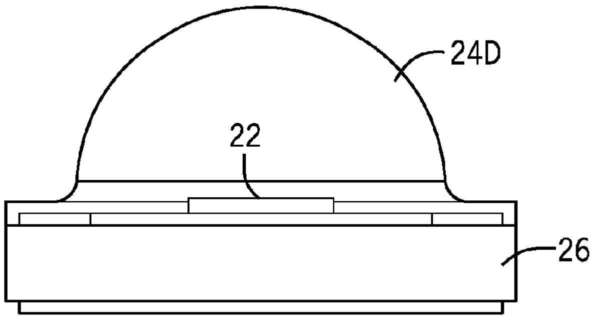
FIG. 30 is an enlarged side view of the LED package of FIG. 31.
Figure 31:
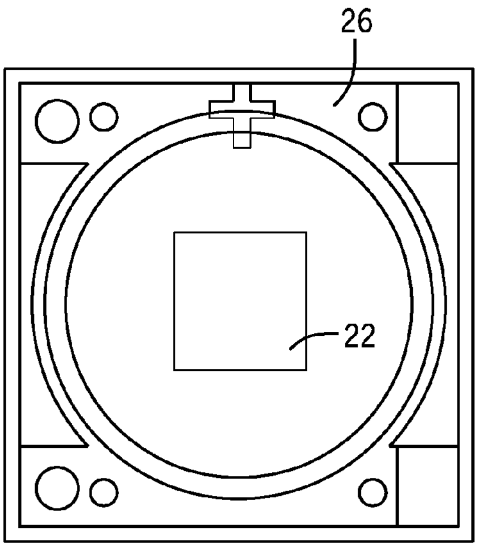
FIG. 31 is an enlarged top plan view of the LED package of FIG. 31.

FIGS. 29-31 show LED package 23D with a single LED 22 on a submount 26 and a hemispheric primary lens 24D coaxially overmolded on submount 26 over LED 22.

In fixtures utilizing a plurality of emitters, a plurality of LEDs or LED arrays may be disposed directly on a common submount in spaced relationship between the LEDs or LED arrays each of which is overmolded with a respective primary lens. These types of LED emitters are sometimes referred to as chip-on-board LEDs. LED optical member 29 is a secondary lens placed over the primary lens. In embodiments with a plurality of LED emitters (packages), optical member 29 includes a plurality of lenses 28 each positioned over a respective one of the primary lenses. The plurality of secondary lenses 28 are shown molded as a single piece 29 with a single flange surrounding each of the plurality of lenses 28.

FIG. 5 also illustrates LED illuminator 41 including a securement structure which includes rigid peripheral structure 411 which applies force along the circuit-board peripheral area toward heat sink 42. This structure serves to increase thermal contact across the facing area of the thermal-engagement surface of circuit board 27 and the surface of heat sink 42 which receives circuit board 27. This arrangement facilitates removal of heat from LED emitters 20 during operation by increasing surface-to-surface contact between the thermal-engagement surface of the circuit board and the heat sink by facilitating excellent, substantially uniform thermal communication from the circuit board to the heat sink, thereby increasing heat transfer from the LEDs to the heat sink during operation. Rigid peripheral structure 411 may be a drawn sheet-metal single-piece structure. As shown in FIG. 5, a gasket 412 is sandwiched between optical member 29 and heat sink 42, thereby facilitating fluid-tight sealing of the circuit board 27. The securement structure is described in detail in patent application Ser. No. 61/746,862, filed Dec. 28, 2012, the entire contents of which are incorporated herein by reference.

Figure 20:
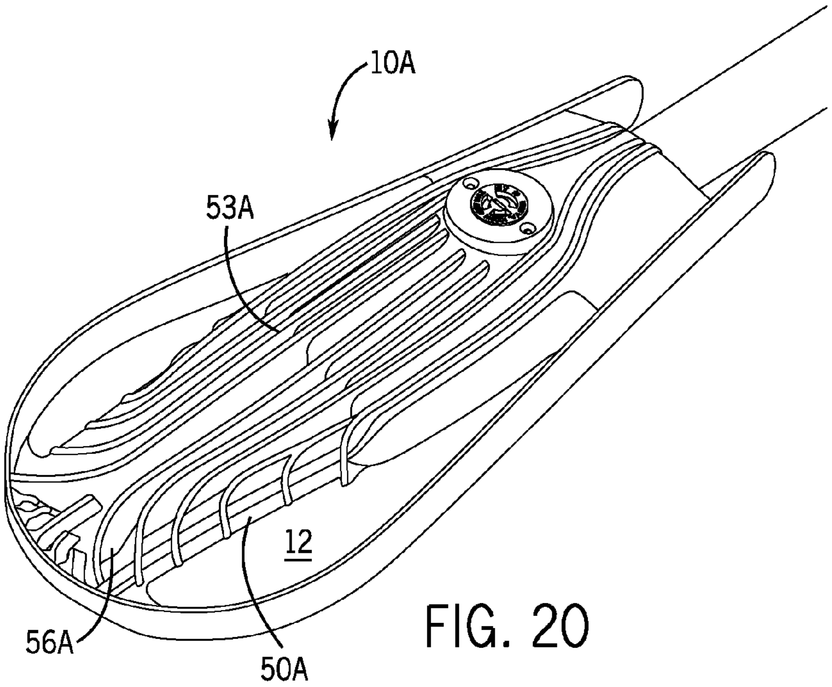
FIG. 20 is a top perspective view of an alternative embodiment of this invention.
Figure 21:
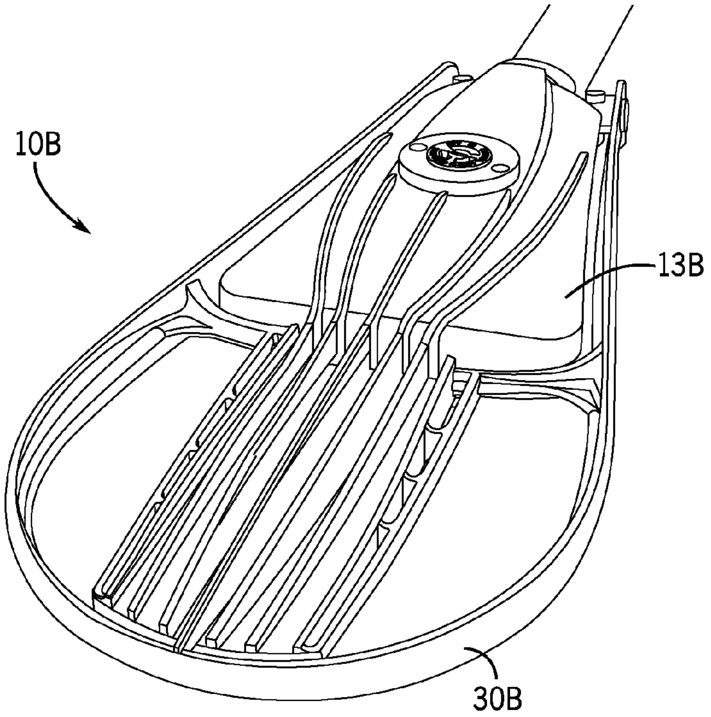
FIG. 21 is a front top perspective view of another alternative embodiment of this invention.
Figure 22:
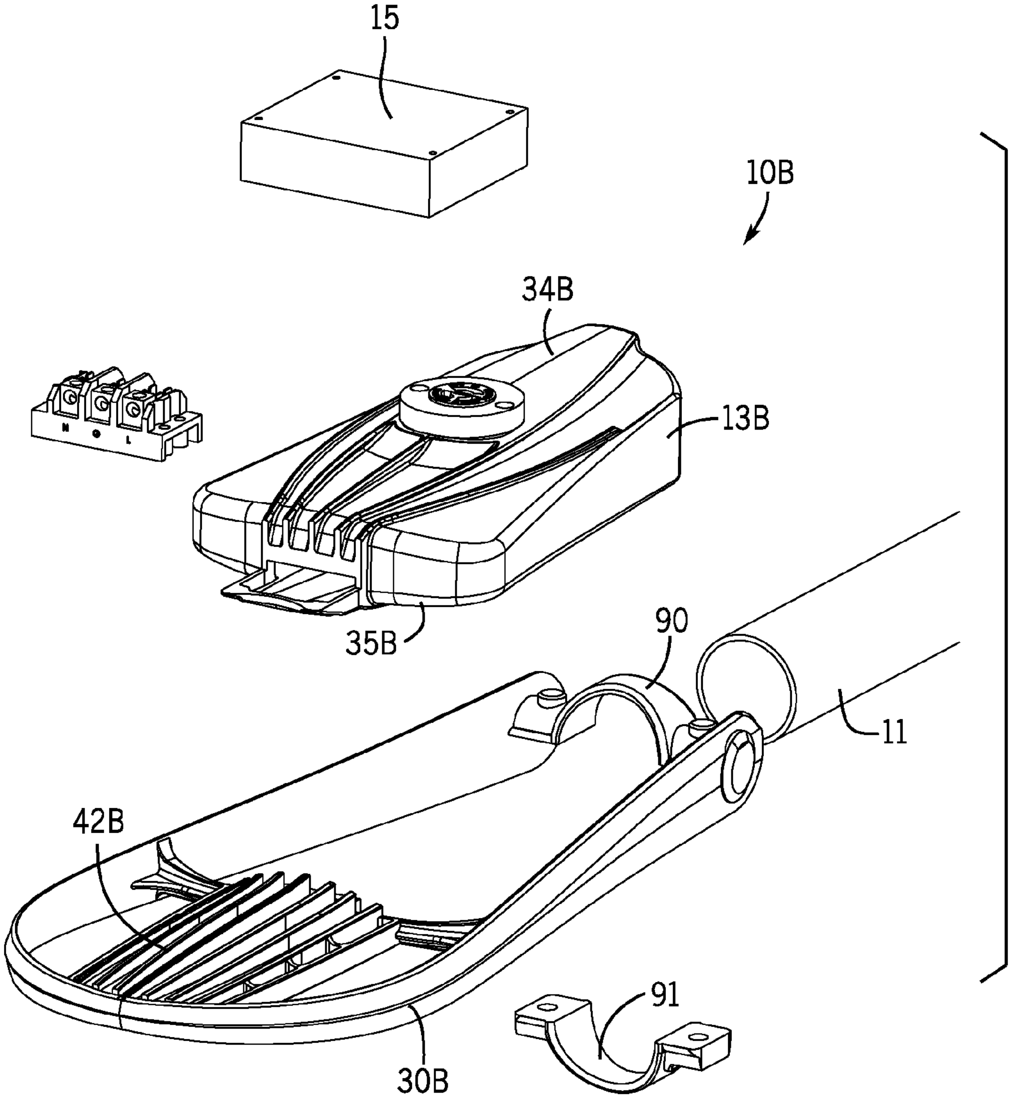
FIG. 22 is an exploded perspective view of the LED light fixture of FIG. 21.

LED light fixture 10 has a housing 17 and LED assembly 40 is secured with respect to housing 17. Housing 17 has an enclosure 13 which is within rearward region 32 and defines a chamber 14 enclosing electronic LED power circuitry 15. As shown in FIGS. 5-7, 9 and 17, enclosure 13 has an upper shell 34 and a lower shell 35. Lower shell 35, which is a one-piece polymeric structure, is movably secured with respect to upper shell 34, which is a metal structure. In various embodiments of the invention, including the first embodiment (which is shown in FIGS. 1-19, 32-33 and 35-37), a second embodiment which is shown in FIG. 20, and a third embodiment which is shown in FIGS. 21 and 22, the heat sink and the frame are formed as a single piece by metal casting. In the first and second of these embodiments, the frame, the heat sink and the upper shell are all formed as a single piece by metal casting.

Figure 6:
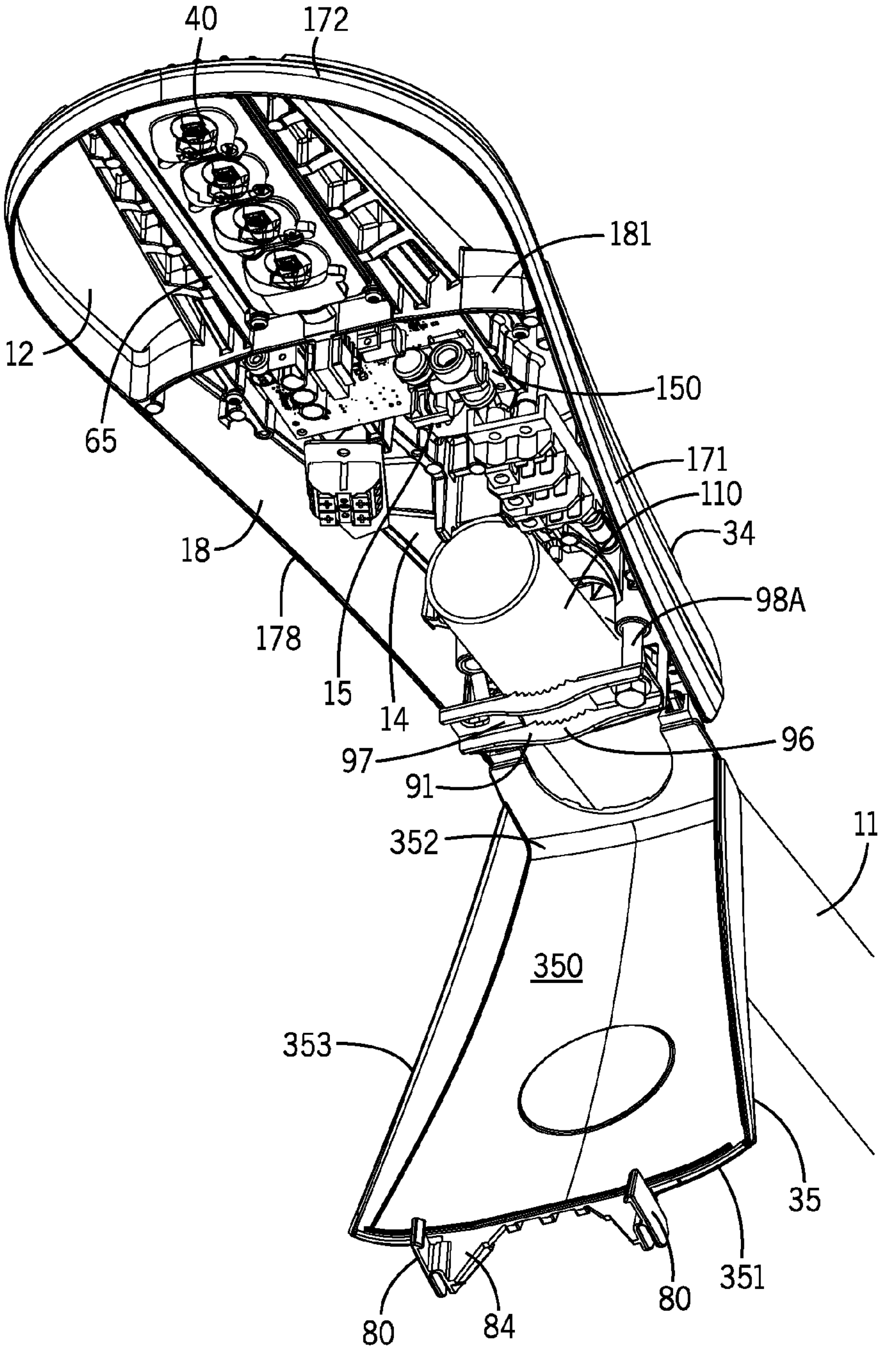
FIG. 6 is another perspective view showing a front of the LED light fixture from below with open cover member and secured to a support member.
Figure 7:
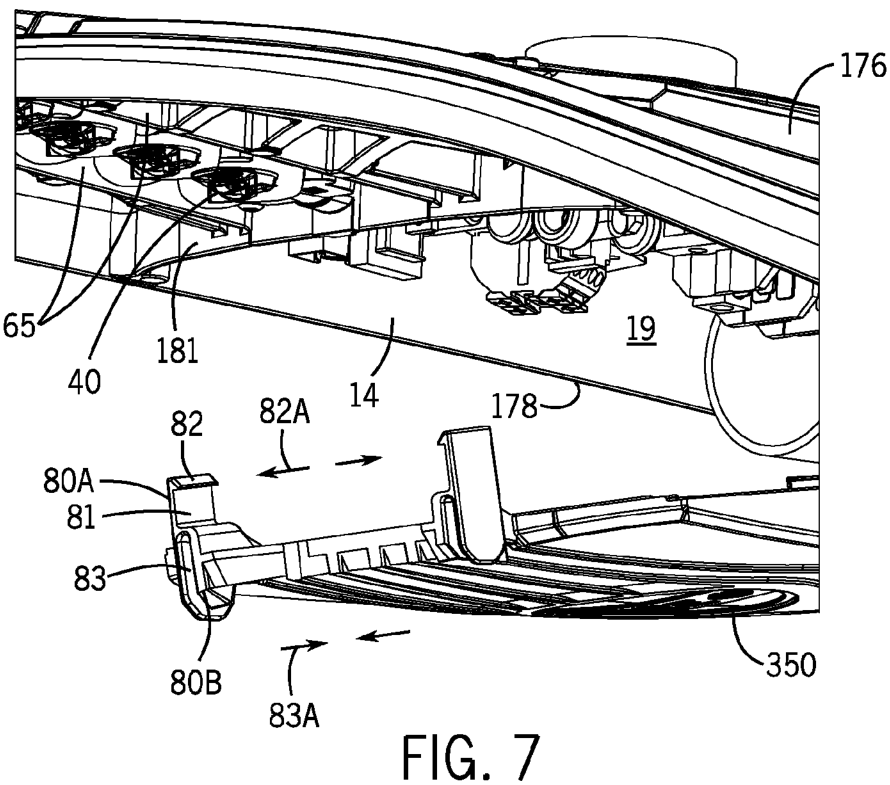
FIG. 7 is a fragmentary perspective view showing the disengaged forward end of the cover member with an integrated latching member.

FIGS. 6 and 7 illustrate electronic LED power circuitry 15 within chamber 14. Such LED power circuitry includes a caseless LED driver 150 which is removably secured to the inner surface of upper shell 34. Driver components of caseless LED driver 150 are encapsulated (potted) in a protective polymeric material prior to installation in the fixture such that Driver 150 is readily replaceable and does not have any potting applied during or after installation in the fixture. Suitable examples of such protective polymeric encapsulating material include thermoplastic materials such as low-pressure injection-molded nylon, which amply protect driver 150 from electrostatic discharge while conducting heat to upper shell 34 to facilitate cooling of the driver during operation.

With lower shell 35 being of polymeric material, a wireless signal can be received by the antenna which is fully enclosed within chamber 14 along with circuitry for wireless control of the fixture. Such circuitry with the antenna may be included as part of LED driver 150. The advantage of the fully enclosed antenna is also available on other embodiments of this invention having enclosures all or portions of which are non-metallic material.

Housing 17 includes a main portion 171 which includes upper shell 34 and lower shell 35 and also includes a forward portion 172 extending forwardly from main portion 171. (Forward portion 172 of housing 17 is the forward portion of frame 30.) In main portion 171, upper shell 34 forms a housing body 176 and lower shell 35 serves as a cover member 350 movably secured with respect to housing body 176.

As shown in FIGS. 6-10 and 17, housing body 176 of the first embodiment has a main wall 170 (the upper portion of upper shell 34) and a surrounding wall 18 extending downwardly therefrom to a housing-body edge 178. Surrounding wall 18 has two opposed lateral wall-portions 180 extending between a forward heat-sink-adjacent wall-portion 181 and a rearward wall-portion 182. Cover member 350 has a forward end 351 and a rearward end 352. FIGS. 6, 8, 9 and 17 show rearward end 352 hingedly secured with respect to rearward wall-portion 182 of housing body 176.

The nature of the hinging securement is seen in FIGS. 3-6, 8, 9, 15, 18 and 19. In particular, polymeric lower shell 35 has an integral hinging member 87 in snap engagement with rearmost portion 33 of frame 30. Hinging member 87 has a pair of engaging portions 88, and the flexibility of the polymeric material of lower shell 35 permits snap engagement of each engaging portion 88 with rearmost portion 33 of frame 30 for secure pivoting thereabout. This provides secure connection of lower shell 35 portion with upper shell 34, allowing lower shell 35 to hang safely in open position during servicing of light fixture 10. In other words, the snap engagement of hinging member 87 with rearmost portion 33 allows controlled disengagement of lower shell 35 from upper shell 34.

Figure 8:
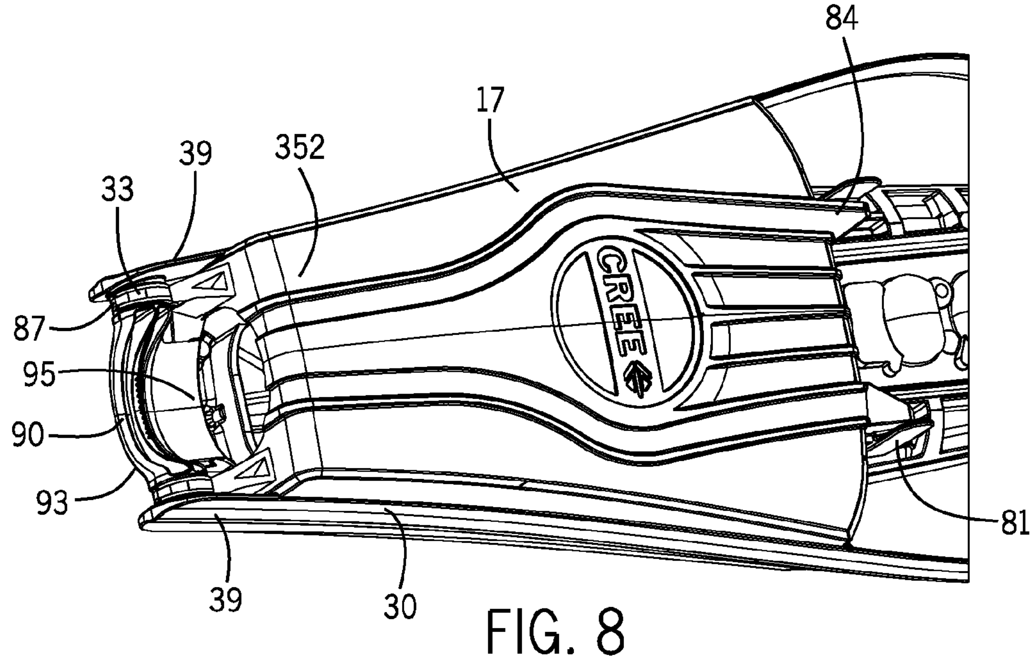
FIG. 8 is another fragmentary perspective view showing the rearward end of the cover member with an integrated hinging member.

As shown in FIGS. 5-7 and 9, forward end 351 of cover member 350 has an integrated latching member 80 detachably securing forward end 351 of cover member 350 with respect to forward wall-portion 181 of housing body 176, thereby closing chamber 14. As seen in FIGS. 6-8, cover member 350 has a cover edge 353 which is configured to engage housing-body edge 178.

FIGS. 5-7, 9 and 17 show that integrated latching member 80 includes a spring tab 81 with a hook 82 at one end 80A and a release actuator 83 at opposite end 80B. FIG. 7 shows hook 82 positioned and configured for locking engagement with respect to housing body 176. Release actuator 83 is configured such that force applied thereto in the direction of arrow 83A pivots hook 82 in opposite direction 82A sufficiently to release hook 82 from the locking engagement. This serves to detach forward end 351 of cover member 350 from housing body 176 to allow access to chamber 14. In should be understood that other suitable locking engagement between cover member 350 and housing body 176 may be possible.

As seen in FIGS. 1-4, 8, 11, 12, 18 and 19, hook 82 is positioned and configured for locking engagement with the one-piece casting. Integrated latching member 80 also includes a cover-member forward extension 84 extending beyond forward wall-portion 181 of housing-body surrounding wall 18. Spring tab 81 is supported by forward extension 84 such that hook 82 is positioned for locking engagement with heat sink 42. As seen in FIGS. 3, 11, 17 and 19, heat sink 42 has a protrusion 85 configured and positioned for locking engagement by hook 82.

Light fixture 10B of the third embodiment, shown in FIGS. 21 and 22 and which as indicated above includes frame 30B and heat sink 42B formed as a one-piece metal casting, has upper shell 34B and lower shell 35B both formed of polymeric material. The enclosure 13B which is formed by such polymeric shells is secured with respect to the metal casting of this embodiment.

Figure 23:
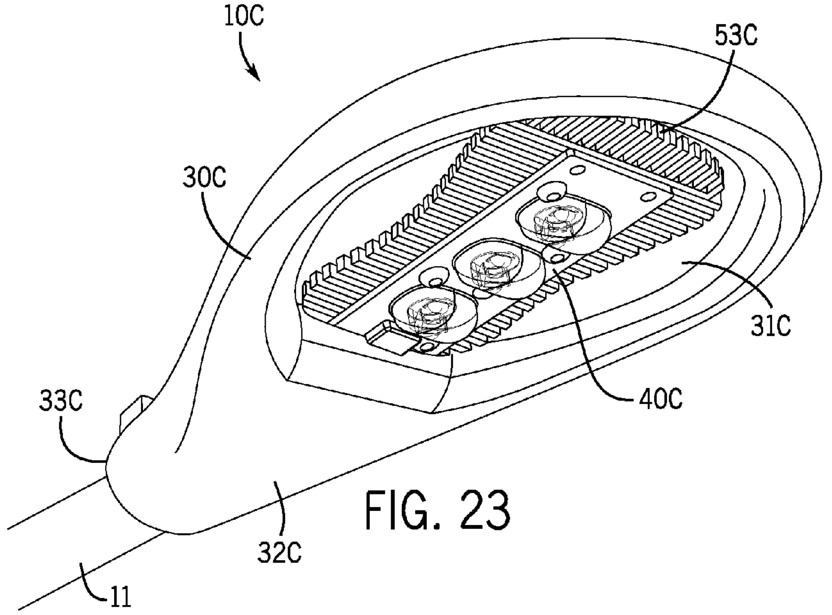
FIG. 23 is a bottom perspective view of yet another alternative embodiment of this invention.
Figure 24:
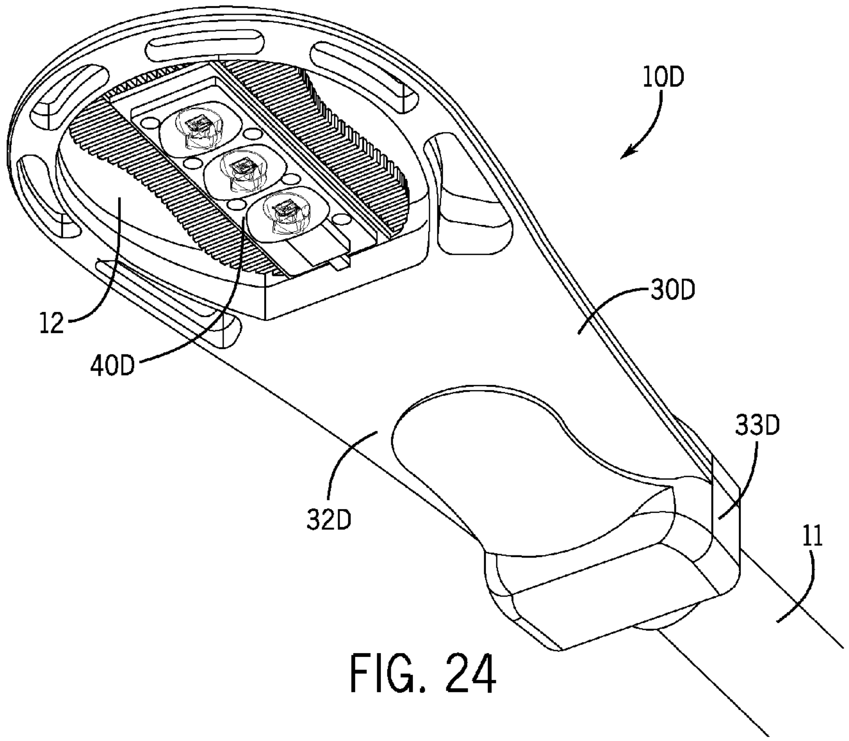
FIG. 24 is a bottom perspective view of still another embodiment of this invention.
Figure 25:
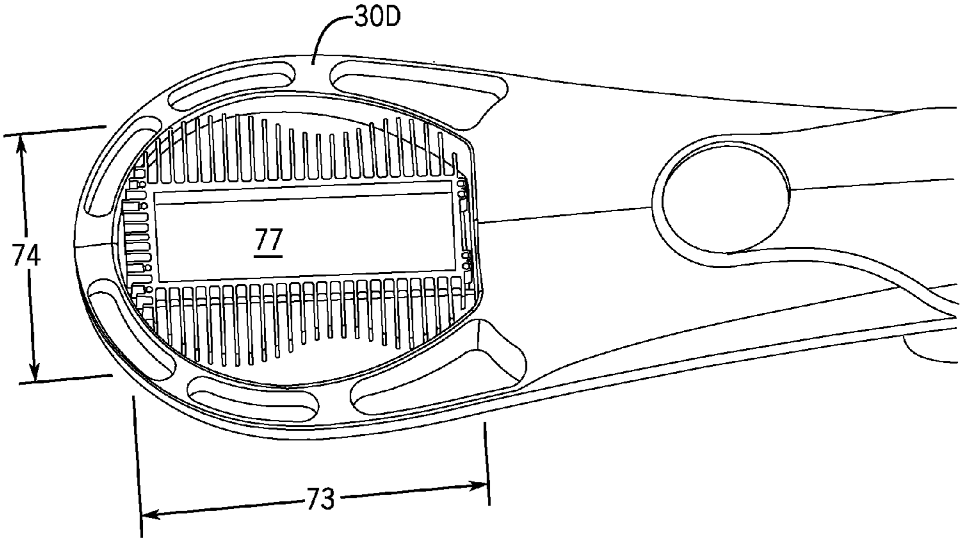
FIG. 25 is a bottom plan view showing the LED light fixture of FIG. 24 without its LED illuminator in place.
Figure 26:
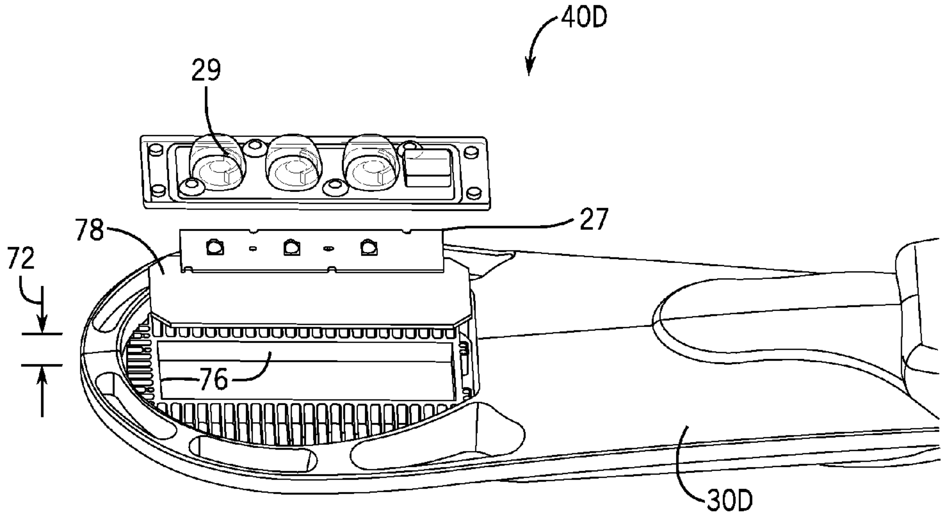
FIG. 26 is a bottom perspective partially-exploded view of the LED light fixture of FIG. 24.

A fourth embodiment of this invention is illustrated in FIG. 23. In such embodiment, LED light fixture 10C has a non-metallic (polymeric) frame 30C. Frame 30C defines a forward open region 31C and has a rearward region 32C with a rearmost portion 33C adapted for securement to support member 11. FIGS. 24-26 illustrate a fifth embodiment of this invention. Light fixture 10D has an LED assembly 40D secured with respect to a non-metallic (polymeric) frame 30D. In the fourth and fifth embodiments, the frame itself serves to for the enclosure for the LED power circuitry, and such circuitry may include a fully-enclosed antenna.

The embodiments of FIGS. 23-26 each include extruded heat sinks which are characterized by having fins extending laterally on either side and forwardly on the front side. In each embodiment, the extruded heat sink has been extruded in a direction orthogonal to both the forward and the lateral directions. The extruded dimension, which is illustrated by numeral 72 in FIG. 26, is less than the forward-rearward and side-to-side dimensions 73 and 74 of such heat sink, as illustrated in FIG. 25. In some embodiments, the fins may be on at least three sides of the heat sink, as seen in FIGS. 34, 40, 38A and 39A. As seen in FIGS. 34, 38-39A, through-spaces 12 may be located along at least two of transverse sides of the heat sink, e.g., at least on one lateral side and on the front and rear sides of the heat sink.

The "short" extrusions of the heat sinks of the fourth and fifth embodiments are facilitated by structure shown best in FIGS. 25 and 26. More specifically, the heat sinks are each formed by an extrusion having a middle portion void, i.e., having walls 76 defining a central opening 77. As seen in FIG. 26, these heat sinks include, in addition to such extrusion, a mounting plate 78 in thermal contact with the extrusion. Mounting plate 78 may be thermally engaged to the extrusion by screws or in other ways. As shown in FIG. 26, LED illuminator 41 is secured to mounting plate 78.

The laterally- and forwardly-extending fins are open to free flow of ambient fluid (air and water), and their position and orientation serve to promote rapid heat exchange with the atmosphere and therefore rapid cooling of the LED illuminator during operation. Upwardly-flowing air and downwardly-flowing water (in the presence of precipitation) facilitate effective cooling, and reduce the need for upwardly-extending fins on top of the heat sinks.

Certain aspects are illustrated best by reference to the first embodiment, particularly as shown in FIGS. 1-7, 9-13, 17-26 and 34. Heat sink 42 of such embodiment has a front side 48, a rear side 49 and lateral sides 50 and is open to ambient-fluid flow to and from the various heat-dissipating surfaces 44. Heat sink 42 includes a central portion 45 and peripheral portions 46 along opposite lateral sides 50. Peripheral portions 46 have peripheral heat-dissipating surfaces 47 along lateral sides 50 of heat sink 42. Central portion 45 includes LED-supporting region 43 and has central heat-dissipating surfaces 51 opposite LED illuminator 41 from which a plurality of elongate fins 53 protrude in a direction opposite LED illuminator 41. Fins 53 extend from front fin-ends 54 adjacent to front side 48 of heat sink 42 to rear fin-ends 55 adjacent to rear side 49 of heat sink 42. As shown in FIGS. 3, 10, 16 and 19-22, some of rear fin-ends 55 are integral with housing 17.

FIGS. 3, 17, 19, 25 and 34 show central-portion openings 52 facilitating ambient-fluid flow to and from heat-dissipating surfaces 51 of central portion 45. Central-portion openings 52 are adjacent to enclosure 13 and are partially defined by housing 17. Fins 53 of central portion 45 define between-fin channels 56 (shown in FIG. 13), which in a mounted position extend along a plane which is close to, but not, horizontal. Between-fin channels 56 are open at front fin-ends 54; i.e., there is no structural barrier to flow of liquid from between-fin channels 56 at front fin-ends 54.

In the second embodiment illustrated in FIG. 20, fins 53A are configured such that between-fin channels 56A are open along the front and lateral sides of the heat sink.

Figure 19:
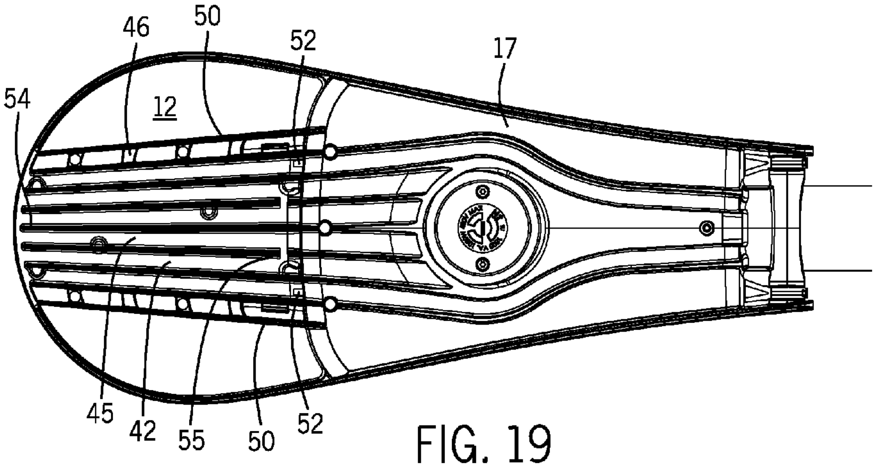
FIG. 19 is a top plan view of the LED light fixture secured to a support member.

Referring again to the first embodiment, FIGS. 3 and 19 show rear fin-ends 55 configured to permit ambient-fluid flow from between-fin channels 56 to central-portion openings 52, thereby to facilitate liquid drainage therefrom. Liquid drainage from the top of heat sink 42 is facilitated by inclination of the top surface of heat sink 42, as explained more specifically below.

Figure 32:
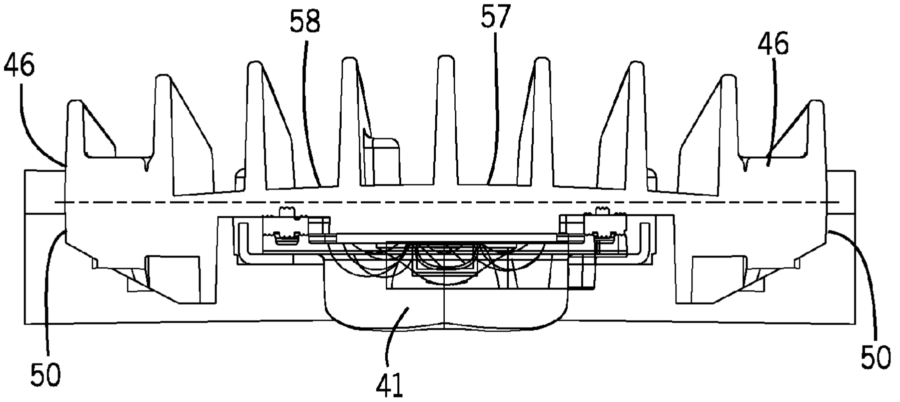
FIG. 32 is a fragmentary side-to-side cross-sectional view taken along section 32-32 as indicated in FIG. 3, illustrating the heat sink having a surface opposite the LED illuminator which slopes toward both lateral sides of the heat sink.
Figure 33:
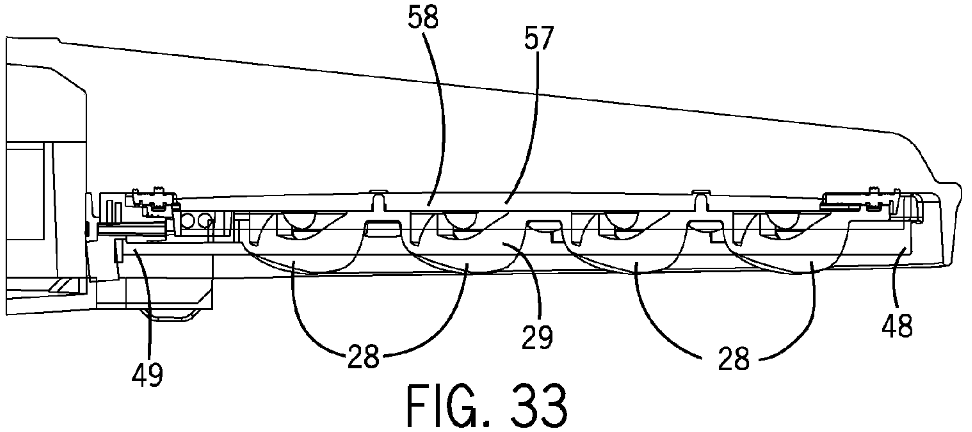
FIG. 33 is a fragmentary front-to-back cross-sectional view taken along section 33-33 as indicated in FIG. 3, illustrating the heat sink having a surface opposite the LED illuminator which slopes toward both the front and back sides of the heat sink.
Figure 34:
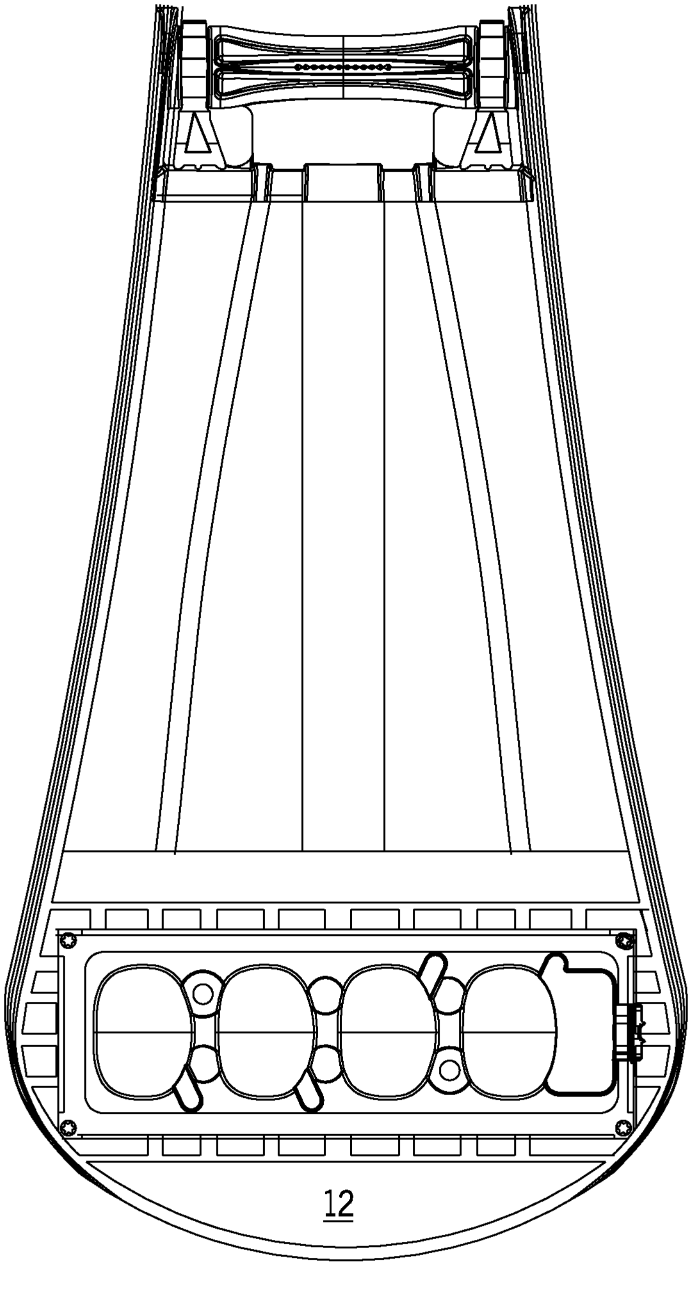
FIG. 34 is a bottom plan view of still another embodiment of the invention.

FIGS. 32 and 33 show between-fin surfaces 57 inclined off-horizontal when light fixture 10 is in its usual use orientation. More specifically, FIG. 32 shows surfaces 57 sloping toward lateral sides 50 of heat sink 42, FIG. 33 shows surfaces 57 sloping toward front and rear sides 48 and 49 of heat sink 42. In other words, portions of surfaces 57 are slightly but sufficiently downwardly inclined toward at least two dimensions and in this embodiment on each of the four sides of heat sink 42.

FIGS. 32 and 33 show LED assembly 40 on a bottom surface of heat sink 42. Heat sink 42, when the fixture is in its mounted orientation, includes a top surface which in plan view has a surrounding edge. FIG. 32 shows the top surface sloping downwardly toward the surrounding edge in opposite lateral plan-view directions, thereby to facilitate liquid drainage from the heat sink FIG. 33 shows the top surface sloping downwardly toward the surrounding edge in the forward and rearward directions. FIG. 32 further shows plurality of elongate fins 53 protruding from the top surface in a direction opposite LED illuminator 41. Sloping top surface includes between-fin surfaces 57.

Figure 2:
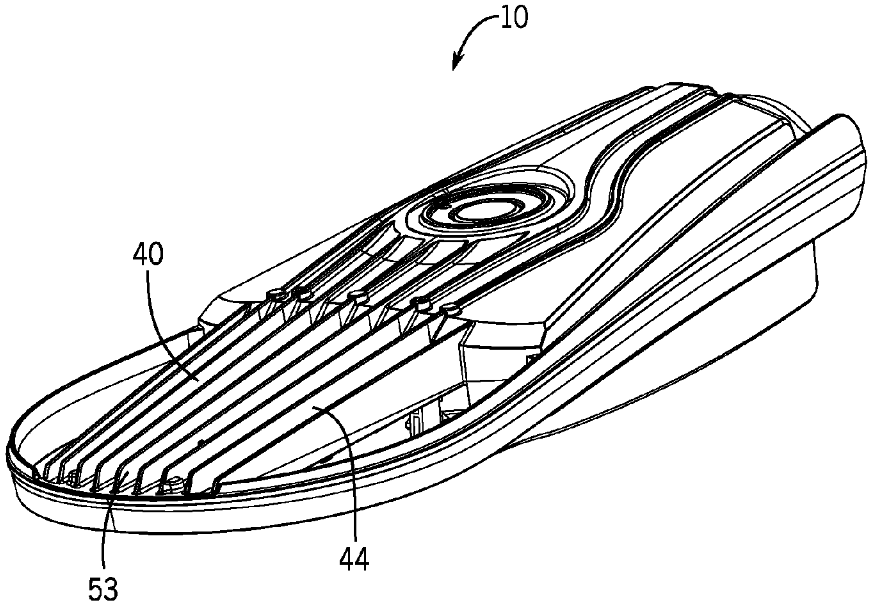
FIG. 2 is a perspective view from above of the LED light fixture of FIG. 1.
Figure 14:
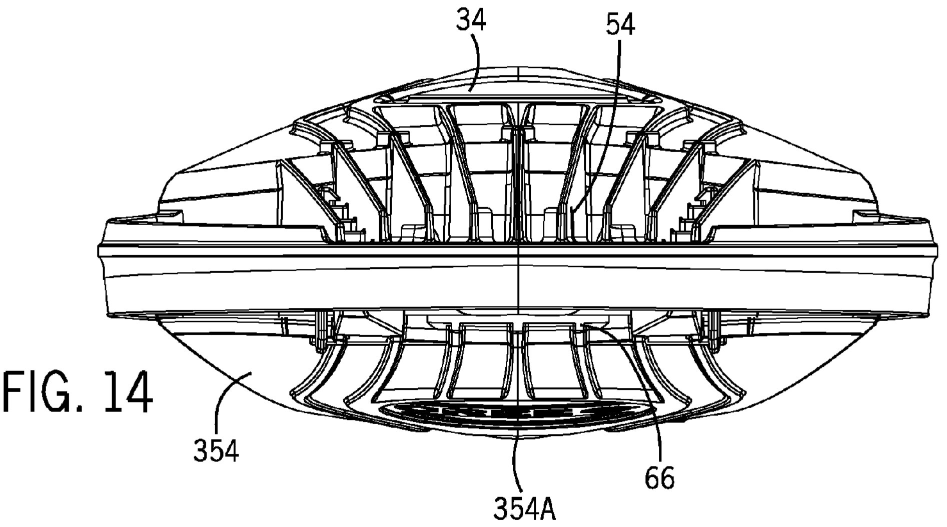
FIG. 14 is a front elevation of the LED light fixture of FIG. 1.
Figure 15:
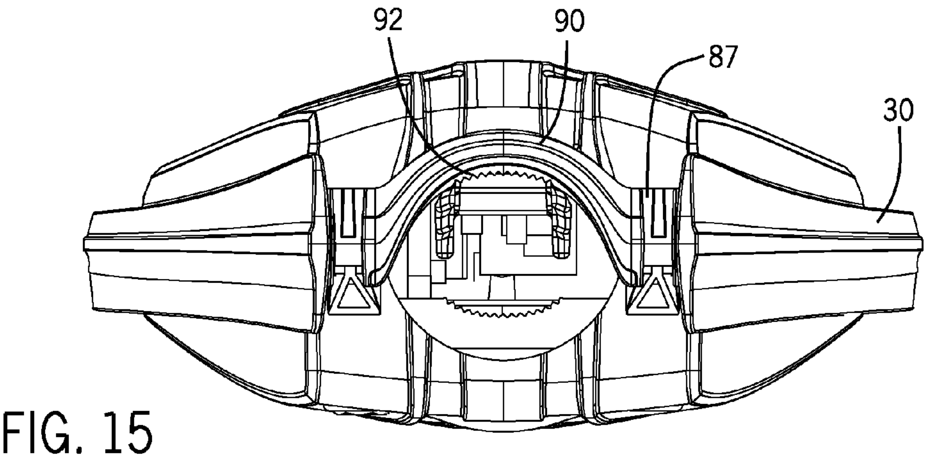
FIG. 15 is a rear elevation of the LED light fixture of FIG. 1.
Figure 16:
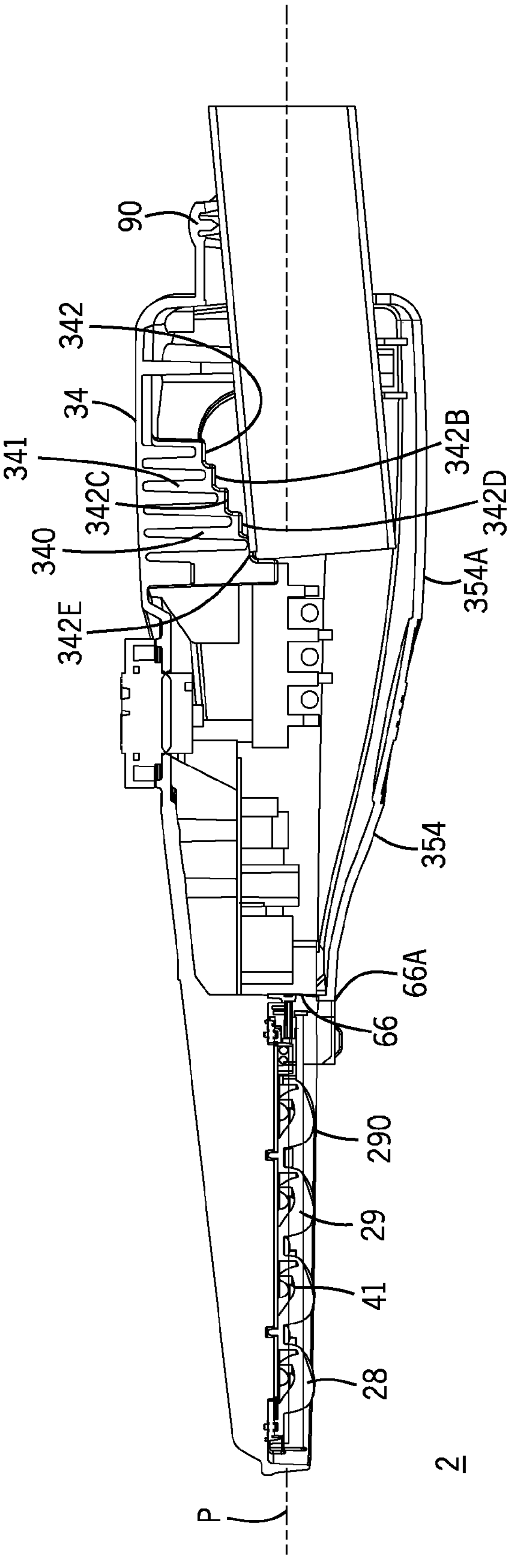
FIG. 16 is a side cross-sectional view of the LED light fixture taken along section 16-16 as indicated in FIG. 4.

FIGS. 2 and 16 show housing 17 including a housing top surface sloping downwardly in the forward direction. These figures also show the top housing surface sloping toward the top surface of heat sink 42, whereby liquid drainage from the housing facilitates cooling of heat sink 42. FIGS. 14 and 15 show the housing top surface sloping downwardly in opposite lateral plan-view directions, thereby to facilitate liquid drainage therefrom.

Housing upper shell 34 and heat sink 42 are formed as a single piece, whereby the housing upper shell facilitates heat dissipation. The heat sink, the frame and the housing upper shell are formed as a single piece.

Figure 13:
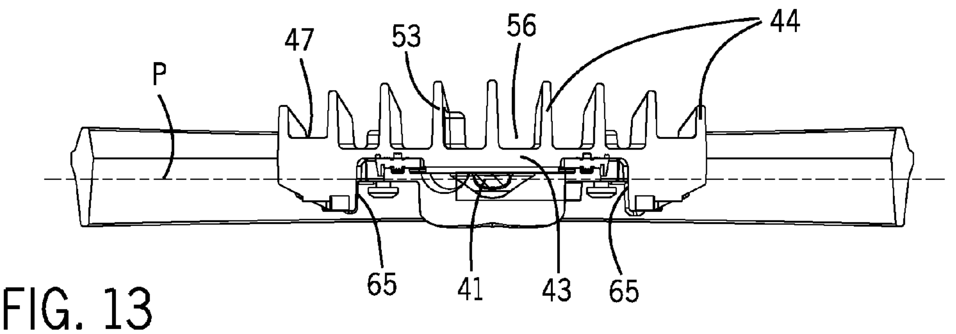
FIG. 13 is a side-to-side cross-sectional view of the LED light fixture taken along section 13-13 as indicated in FIG. 4.

In addition to the above-described sloping, LED light fixture 10 has various advantageous structural taperings. As seen best in FIGS. 3 and 4, heat sink 42, in plan view is tapered such that it is wider at its rearward end than at its forward end. Additionally, as seen in FIGS. 2 and 16, each of central-portion fins 53 has a tapered configuration such that its vertical dimension at the rearward end of heat sink 42 is greater than its vertical dimension at the forward end of heat sink 42. Furthermore, as seen in FIGS. 13 and 14, fins 53 have progressively lesser vertical dimensions toward each of opposite lateral sides 50 of heat sink 42.

As shown in FIGS. 1, 5, 6 and 11-13 and 32, peripheral portions 46 of heat sink 42 extend along opposite lateral sides 50. Peripheral heat-dissipating surfaces 47 include a plurality of fins 59 extending laterally from central portion 45 of heat sink 42, with open spaces 60 formed between adjacent pairs of fins 59. As seen in FIGS. 3, 4, 11-13 and 17-19, peripheral portion 46 also has a peripheral fin 59A along each lateral side 50 of heat sink 42. Peripheral fins 59A extend in length from front fin-ends 54A adjacent to front side 48 of heat sink 42 to rear fin-ends 55A adjacent to rear side 49 of heat sink 42. Rear fin-ends 55A of peripheral fins 59A are integral with housing 17. The configuration of peripheral portions 46 of heat sink 42 serve to facilitate cooling by providing additional heat-exchange surfaces in particular effective locations.

The various embodiments disclosed herein each illustrate one aspect of the present invention particularly related to the frame and open character of the fixtures. This is discussed in particular with respect to the first embodiment, and in particular with reference to FIGS. 35-37 which schematically illustrate "projected" areas of structure and through-spaces of the fixture in plan view.

More specifically, the first embodiment includes the following projected areas:

total area 36 of light-fixture forward region 31≈67.0 sq.in.;

total area 37 of LED assembly 40≈40.4 sq.in.;

total through-space area of the two lateral side voids 12≈26.5 sq.in.;

total area of the entire fixture≈160 sq. in.

Figure 35:
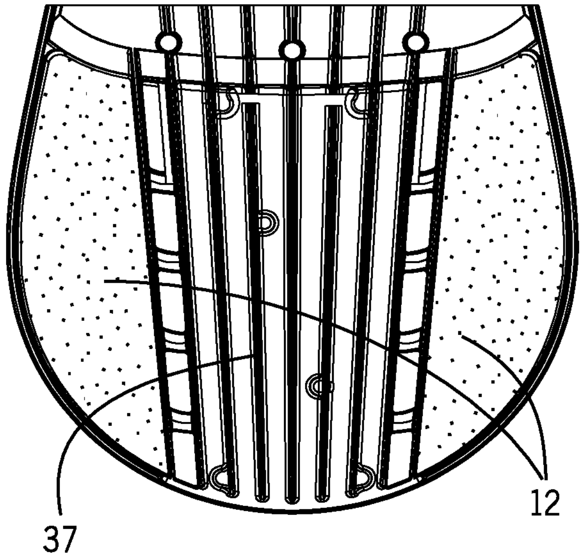
FIGS. 35-37 are schematic top plan views of the LED light fixture of FIG. 1, such figures serving to indicate particular projected areas of the fixture for purposes of facilitating description of certain aspects of the invention.
Figure 36:
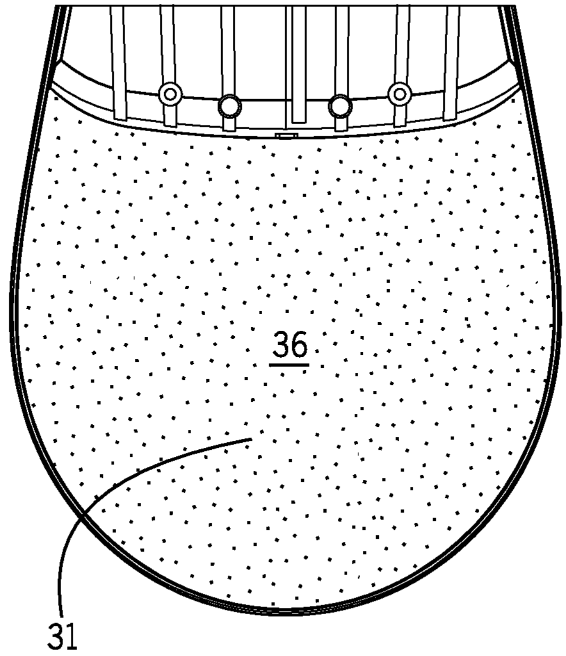
Figure 37:
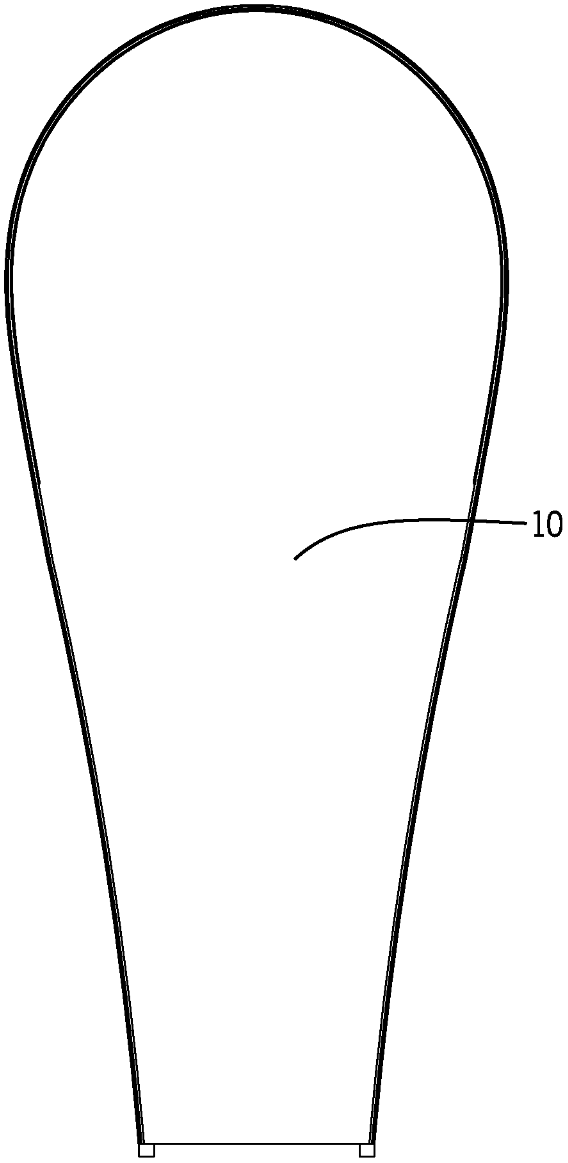
Figure 40:
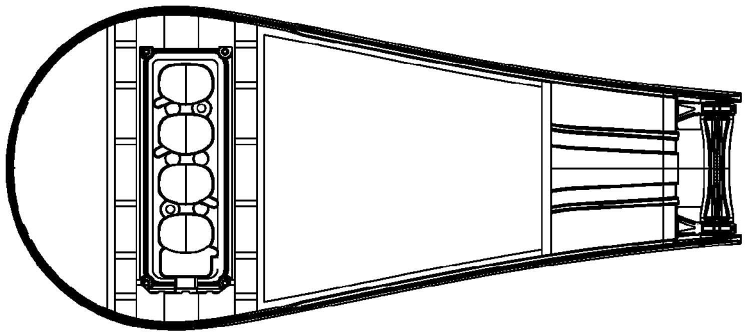
FIGS. 38-40 are bottom plan views of still alternative embodiments of the invention.
Figure 39:
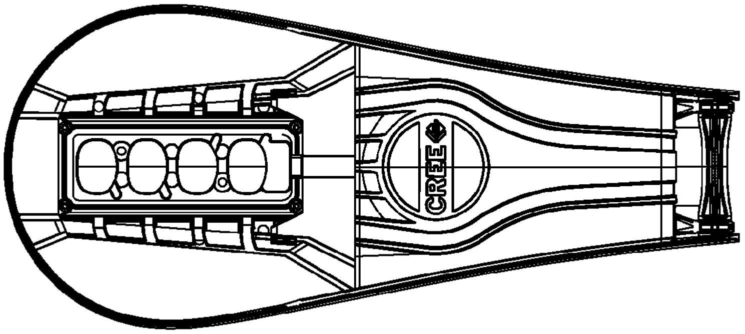
Figure 38:
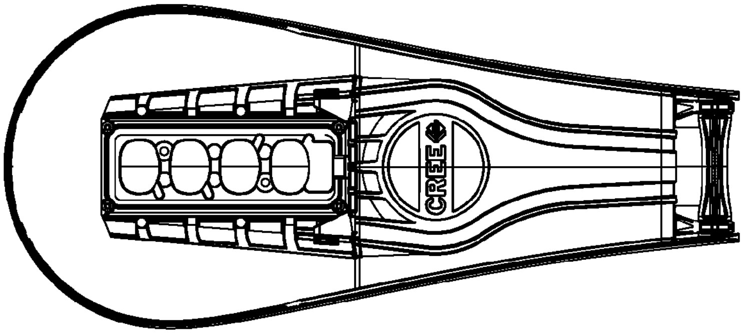
Figure 38A:
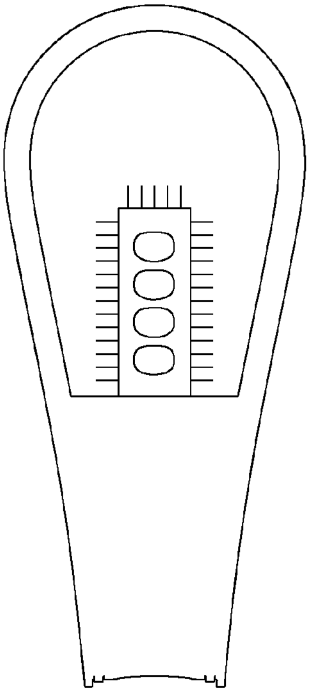
Figure 39A:
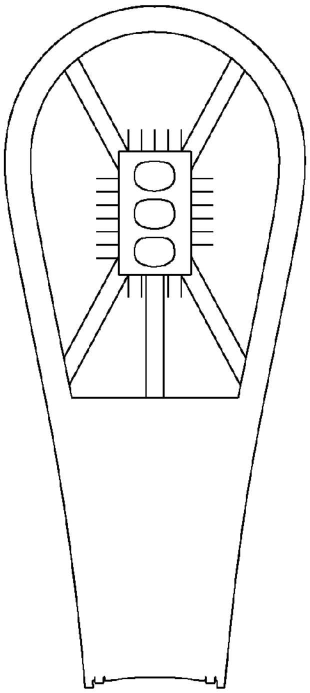
Figure 40A:
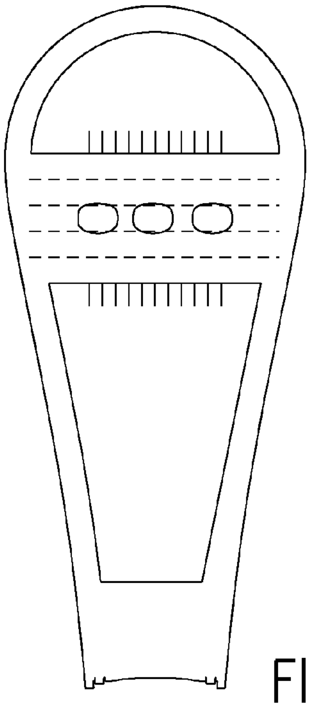

FIGS. 35-37 show projected LED-assembly area 37 of about 60% of the projected forward-region area 36. The total through-space area of the two lateral side voids 12 is about two-thirds of projected LED-assembly area 37.

When describing the openness aspect of this invention using reference to the illuminator plane P indicated in FIGS. 13 and 16, plane P is defined by LED illuminator 41 directly facing the area to be illuminated. The intersections referred to above with such plane P are illustrated in FIGS. 35 and 37.

Using such parameters, the total through-space area in the illuminator plane is slightly over 15% of the fixture area. And, if the light fixture is configured such that the enclosure with its LED power circuitry, rather than being beside the LED assembly, is offset above or otherwise away from the LED assembly (such as being in the support member), then the total through-space area in the illuminator plane may be at least about 40% of the fixture area. Described differently, the total through-space area in illuminator plane P is about two-thirds of the projected LED-assembly area.

While openness is discussed above with particular reference to the first embodiment, it should be noted that FIG. 20 illustrates an embodiment in which light fixture 10A has openness along the majority of its length. More specifically, the openness extends well to the rear of the forward portion of fixture 10A, i.e., well to the rear of the LED assembly of such fixture, including on either side of the enclosure.

Such openness in an LED light fixture offers great flexibility from the standpoint of form-factor design, e.g., allowing overall shape of the fixtures to better accommodate replacement of existing non-LED fixtures of various shapes. Several of the embodiments disclosed herein have frames which at least in their forward portions provide a footprint substantially similar to the footprint of so-called "cobrahead" light fixtures. This is achieved despite the fact that the LED assemblies used in fixtures according to the resent invention have substantially straight opposite lateral sides, as seen in the figures.

The advantages of the openness disclosed herein extend beyond form-factor concerns. Just one example includes avoiding or minimizing accumulation of snow, leaves or other materials on the fixtures.

Another aspect of the present inventive light fixtures is illustrated in FIGS. 1, 6, 7 and 11-13. Referring in particular to the first embodiment, central portion 45 of heat sink 42 has downwardly-extending shield members 65 at lateral sides 50 of heat sink 42. Shield members 65 are configured and dimensioned to block illumination which, when fixture 10 is installed as street-light, minimize upward illumination. This facilitates compliance with "dark-sky" requirements for limiting light pollution.

FIG. 16 shows that optical member 29 is configured for directing emitter light in preferential direction 2 toward the forward side. FIGS. 1, 6, 7, 11-14 and 16 show a downwardly-extending shield member 66 at rearward side 49 of central heat-sink portion 45. Shield member 66 is configured and dimensioned to block rearward illumination. Rearward shield member 66 extends to a position lower than the lowermost outer-surface portion 290 of optical member 29. Rearward shield member 66 may include a reflective coating redirecting rearward light.

FIGS. 1, 6, 7, 11-14 and 16 show that forward wall-portion 181 of housing main portion 171 partially defines rearward shield member 66. These figures also show cover-member forward end 351, which is secured to forward wall-portion 181 of housing body 176, partially defining rearward shield member 66. Reflective or white coating of housing 17 may provide reflective characteristics for redirecting rearward light toward the preferential forward side 2.

As seen in FIGS. 1, 5, 14 and 16, cover member 350 has a cover wall 354 extending between rearward and forward ends 352 and 351. Cover wall 354 includes a lowermost portion 354A which is at a position lower than lowermost position 66A of rearward shield member 66 to further block rearward illumination. Reflective or white coating of cover wall 354 may provide reflective characteristics for redirecting rearward light in useful direction.

In some prior LED devices, back-light shielding has been in the form of individual shields disposed on a non-preferential side of each LED emitter. Some of such prior shielding was positioned over the exterior of a corresponding lens. In such prior cases, over time the back-light shielding often became covered with dist or other ambient particles and simply absorbed rearward light from the respective LED emitter. Such absorption translated in decreased efficiency of light output from such LED device. In other examples, prior back-light shielding was positioned inside each lens corresponding to each individual LED emitter. While protected from contamination, such shielding resulted in lenses which were both complex and expensive to manufacture. In either type of the back-light shielding disposed on the non-preferential side of each individual LED emitter, there was still some undesired light in the rearward direction. Such light, escaping the prior lens-shield configuration through unintended refraction or reflection by the lens.

In some other prior examples of back-light shielding used in light fixtures, such shields were in the form of a separate structure secured with respect to the fixture rearwardly to the illuminator. Such separate shielding structures often requires complicated securement arrangements as well as interfered with the overall shape of the light fixture.

The integrated back-light shielding of the present invention, provides effective blocking of rearward light and providing reflection of such light away from areas of undesired illumination. The reflection provides by the integrated back-light shield of this invention facilitates higher light-output efficiency of the LED illuminator used in the LED light fixture of the present invention. The integrated nature of the back-light shielding of the present invention provides all the benefits of a single back-light shield without disruption of the overall shape of the fixture. Furthermore, the back-light shielding of the present invention is defined by surfaces which are open to air and water flow, which facilitates self cleaning of the reflective surface and minimized absorption of light received by such shield surface.

Another aspect of this invention is illustrated best in FIGS. 3-6, 8-10, 15-19, 21 and 22. These figures show an exterior fulcrum 90 of fixture 10 affixed to rearward portion 33 of the fixture. Fulcrum 90 is configured to pivotably engage one side 11A of support member 11 when a fixture-adjacent end 110 of support member 11 is within fixture interior 19. FIGS. 5, 6, 9, 16, 17 and 22 show that fixture 10 also includes an engager 91 secured within fixture interior 19 in position to engage the opposite side 11B of support member 11 at a position offset from fulcrum 90. This arrangement holds fixture 10 in the desired orientation when support member 11 is held between fulcrum 90 and engager 91.

Figure 9:
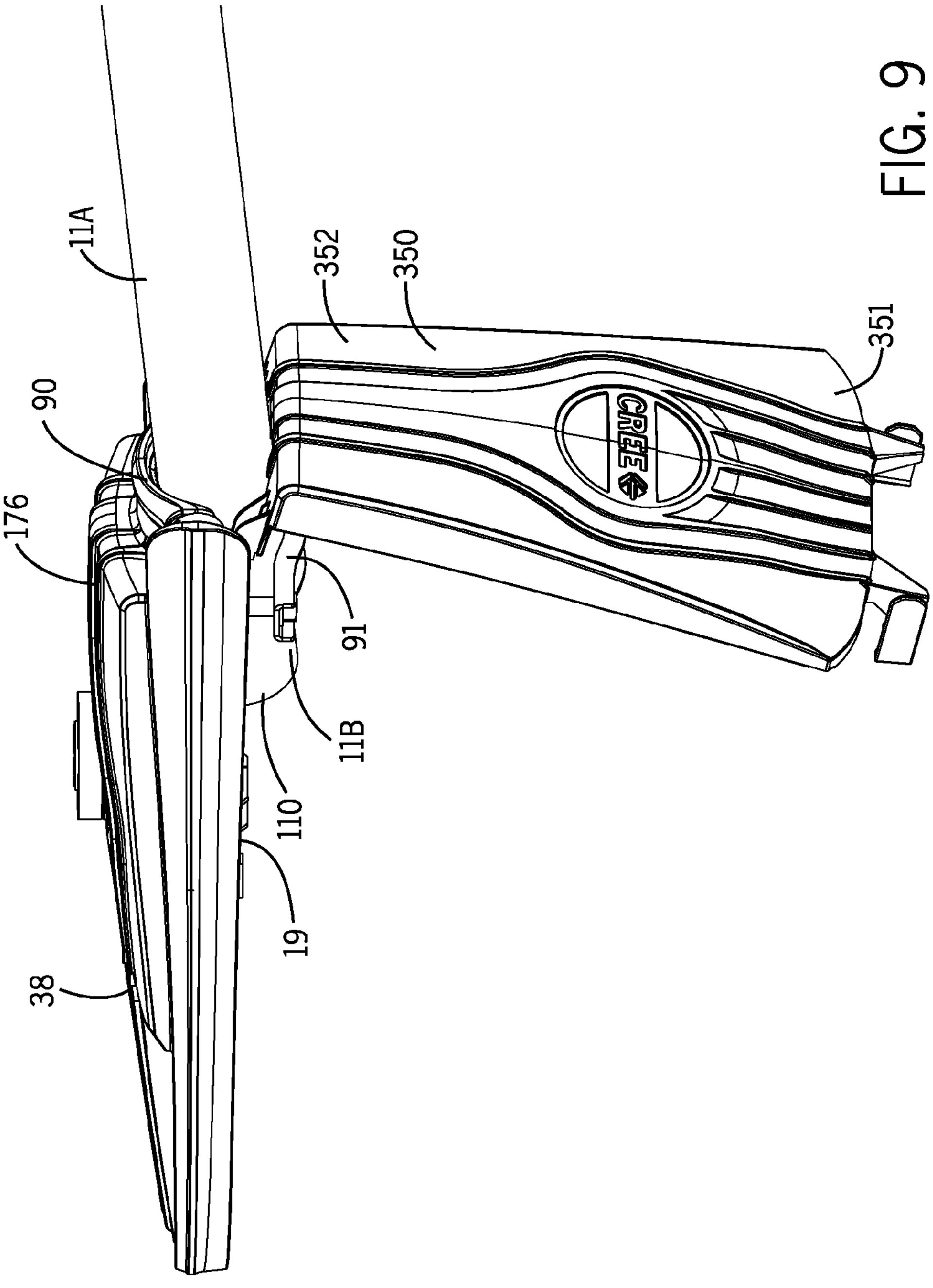
FIG. 9 is a side rear perspective view showing the LED light fixture secured with respect to a support member and having its cover member hanging open.
Figure 10:
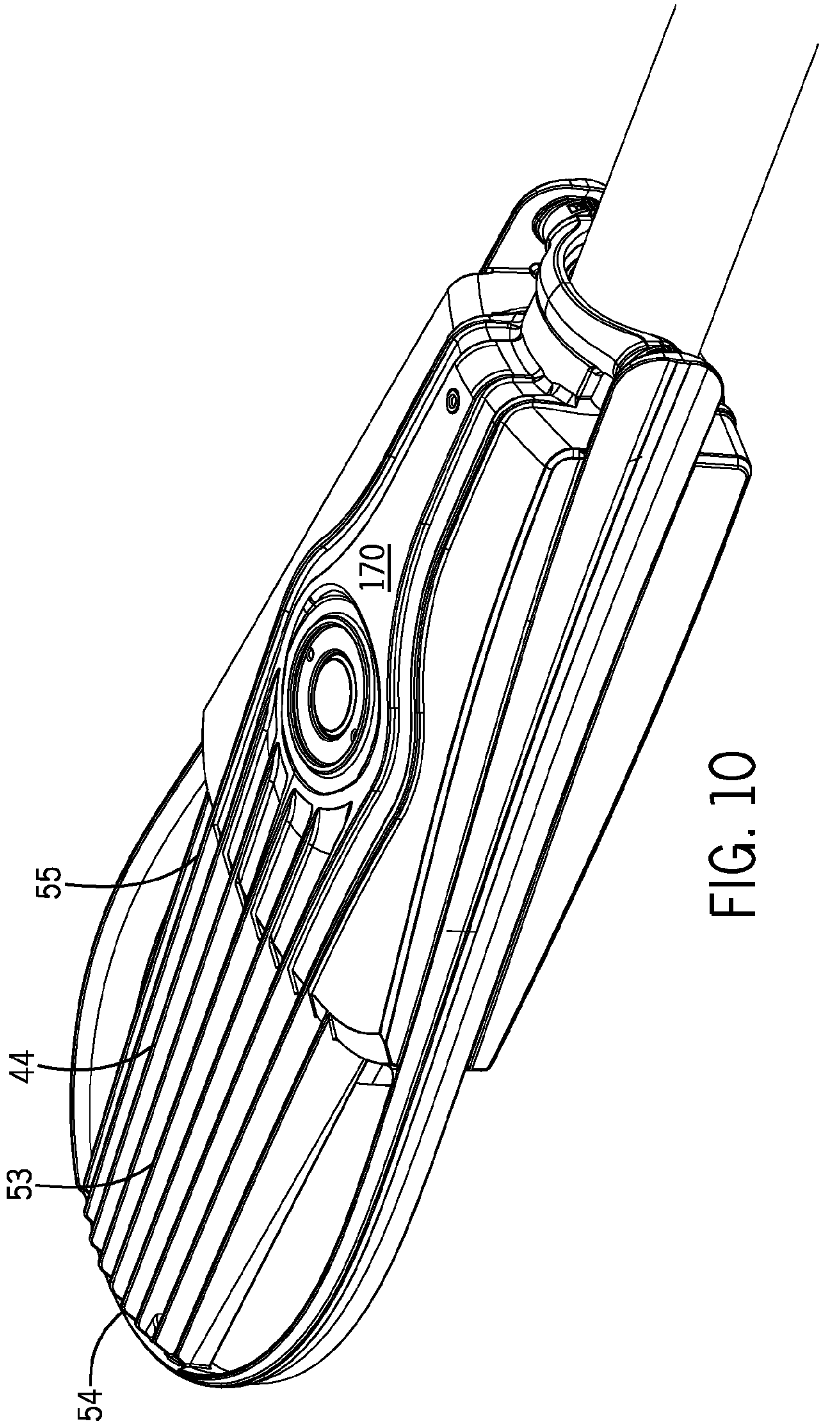
FIG. 10 is a top rear perspective view showing the LED light fixture secured with respect to the support.
Figure 11:
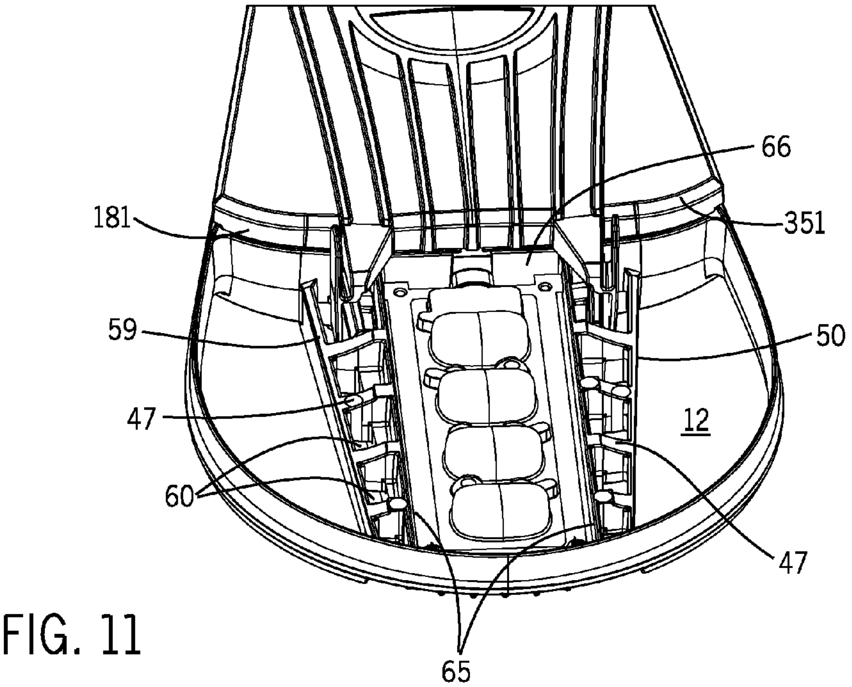
FIG. 11 is a fragmentary front perspective view from below illustrating the forward region of the fixture with its LED assembly therein, including its LED illuminator.
Figure 12:
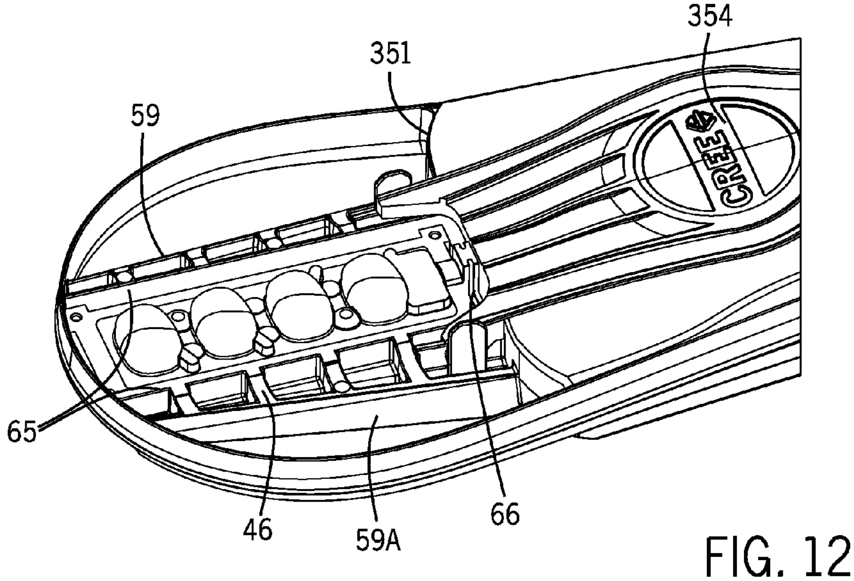
FIG. 12 is a fragmentary side perspective view from below showing the same portions of the fixtures as shown in FIG. 11 from a somewhat different angle.

FIGS. 8-10 show that fulcrum 90 is shaped to limit lateral movement of support member 11 thereagainst by its cradling shape and the fact that fulcrum 90 includes a row of teeth 92 configured to engage support member 11.

Fulcrum 90 is part of a fulcrum member 93 which also includes support structure 95 for fulcrum 90. FIGS. 3, 4, 8-10, 15, 18 and 19 show frame 30 having a pair of rearmost extensions 39 between which fulcrum 90 is secured. FIG. 10 also shows heat sink 42, frame 30, upper shell 34 and fulcrum 90 formed as a single piece.

The exterior fulcrum provides advantages such as allowing a smaller aperture for a support-member entry into the fixture interior 13 as well as easier access to the interior by providing more room for clearance of a compartment door has more clearance. The smaller entry aperture may eliminate the need for a splash guard which is typically required for UL listed outdoor light fixtures, while still providing for the possibility of a splash-guard arrangements.

Figure 17:
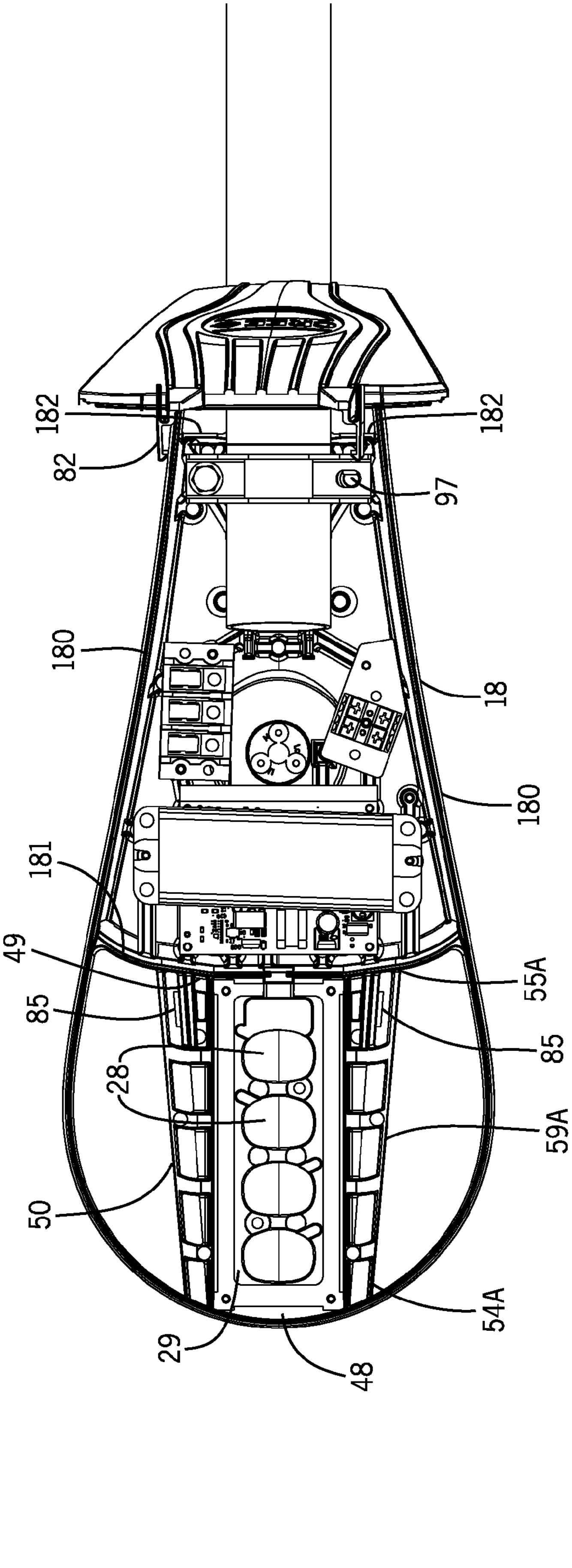
FIG. 17 is a bottom plan view of one embodiment of the LED light fixture secured to a support member and with its cover member open.
Figure 18:
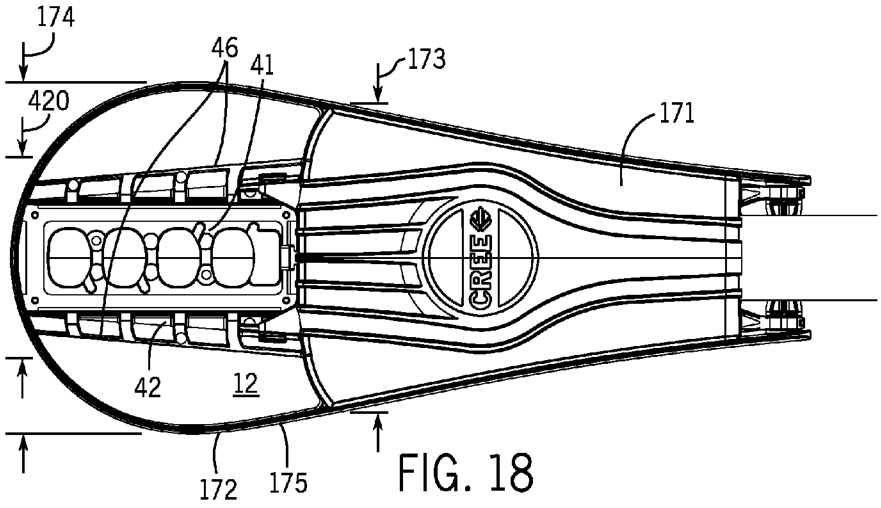
FIG. 18 is a bottom plan view similar to FIG. 17 but with the cover in its closed position.

As shown in FIGS. 6, 9 and 17, engager 91 is adjustably secured with respect to upper shell 34 and includes a yoke 96 shaped to substantially conform to the shape of support member 11. Yoke 96 has a pair of pin-receiving apertures 97 with a shaft portion 98A of a corresponding pin 98 extend therethrough into threaded engagement with upper shell 34.

FIGS. 16 and 17 show that fixture interior 19 has an angle-referencing region 340 shaped to engage fixture-adjacent end 110 of support member 11 in order to facilitate positioning of fixture 10 (with respect to support member 11) within one of plural predetermined angle ranges 342. FIG. 16 shows angle-referencing region 340 as a step-like configuration extending downwardly from upper shell 34. Steps 341 each correspond to one of the plural predetermined angle ranges such that, depending on which of steps 341 is selected for engagement by fixture-adjacent end 110 of support member 11, adjustment of engager 91 locks fixture 10 at a particular angle with respect to support member 11 within the range of the selected step 341. Such predetermined angle ranges are range 342A (which includes the range of about −5° to about −2.5°), range 342B (which includes the range of about −2.5°) to about 0°), range 342C (which includes the range of about 0° to about +2.5°), range 342D (which includes the range of about +2.5° to less than about +5°), and range 342E (which includes the range of about +5°).

FIGS. 3 and 4 show light fixture 10 which in plan view has central and outward portions. The central portion includes housing 17 enclosing LED power circuitry, heat sink 42 secured with respect to housing 17 and supporting LED illuminator 40. The central portion also includes a mount adapted for securement to support member 11. As seen in FIGS. 3 and 4, outward portion defines an outer plan-view shape of fixture 10 and is secured to the central portion with through-space(s) 12 between the central and outward portions.

As further seen in FIGS. 3, 4, 18 and 19, through-spaces 12 are along heat sink 42 on opposite sides thereof. Through-spaces are shown along opposite sides of the central portion. FIG. 20 shows through-spaces 12 beings along housing 17.

The outward portion has an outer perimeter which in plan view may be substantially similar to the footprint of a cobrahead non-LED light fixture.

This invention gives great flexibility in providing LED light fixtures for a variety of particular roadway lighting and other similar outdoor lighting purposes. The desired light-output level determined by the particular application and/or determined by dimensional constrains (e.g., pole height, area to be illuminated, and desired foot-candles of illumination in the target area) can be varied substantially by selection of the particular appropriate LED illuminator and chosen power level, with or without modification of heat-sink size, without departing from a particular desired form factor, such as the above-mentioned "cobrahead" form. The open "footprint" of the fixture of this invention allows such flexibility in a light fixture with advantageous performance characteristics, both in light output and in heat dissipation.

One example of such light fixture is the fixture referred to as the first embodiment. Such particular fixture with a chosen four LED emitters and a heat sink as shown at power level of twenty-four watt gives an output of about 2411-2574 lumens depending on LED correlated color temperature (CCT). The same fixture with applied power of 42 watt gives an output of about 3631-3884 lumens again depending on LED CCT. Higher lumen outputs can be achieved by corresponding adjustments in the number and nature of LED emitters with or without corresponding adjustment of the heat sink. These changes can be made with or without change in the "footprint" of the fixture.

While the principles of the invention have been shown and described in connection with specific embodiments, it is to be understood that such embodiments are by way of example and are not limiting.

The invention claimed is:

1. An LED lighting fixture comprising a housing portion and an LED-supporting heat sink having lateral, front and rear sides and being open for air/water-flow along each of the sides, the housing portion defining a venting gap permitting air/water-flow to and from the LED-supporting heat sink.

2. The LED lighting fixture of claim 1 wherein:

the housing portion includes a substantially closed chamber enclosing at least one electronic LED driver; and the heat sink includes an LED-supporting region and heat-dissipating surfaces extending therefrom; and an LED illuminator secured with respect to the LED-supporting region of the heat sink.

3. The LED light fixture of claim 2 wherein the heat sink includes central and peripheral portions, the central portion including the LED-supporting region and having central heat-dissipating surfaces opposite the LED illuminator, the peripheral portion having peripheral heat-dissipating surfaces along the lateral sides of the heat sink.

4. The LED light fixture of claim 3 wherein the venting gap comprises at least one central-portion venting aperture partially defined by the housing portion and facilitating ambient-fluid flow to and from the central heat-dissipating surfaces.

5. The LED light fixture of claim 3 wherein the central portion of the heat sink has a plurality of elongate fins protruding in a direction opposite the LED illuminator and extending from distal fin-ends adjacent to the front side of the heat sink to proximal fin-ends adjacent to the rear side of the heat sink.

6. The LED light fixture of claim 5 wherein at least one of the proximal fin-ends is secured to the housing portion.

7. The LED light fixture of claim 5 wherein the fins define horizontal between-fin channels open at the distal fin-ends, the proximal fin-ends configured to permit ambient-fluid flow from the between-fin channels to the at least one central-portion aperture, thereby to facilitate liquid drainage therefrom.

8. The LED light fixture of claim 7 wherein each of the peripheral portions has at least one peripheral fin along the heat sink, the peripheral fins extending from distal fin-ends adjacent to the front side of the heat sink to proximal fin-ends adjacent to the rear side of the heat sink.

9. An LED light fixture comprising:

a frame defining a forward region and a rearward region;

the rearward region having (a) an enclosure defining a chamber enclosing electronic LED power circuitry and (b) a rearmost portion adapted for securement to a support member;

the forward region having (i) a heat sink and (ii) open spaces within the frame on either side of the heat sink, the heat sink comprising an LED-supporting region and heat-dissipating surfaces extending therefrom; and an LED illuminator secured with respect to the LED-supporting region.

10. An LED light fixture comprising:

a frame defining a forward region and a rearward region;

the rearward region having (a) an enclosure defining a chamber enclosing electronic LED power circuitry, the enclosure having upper and lower shells, the upper shell and the frame being formed as a single piece, the lower shell being movably secured with respect to the upper shell, and (b) a rearmost portion adapted for securement to a support member;

the forward region having (i) a heat sink and (ii) open spaces within the frame on either side of the heat sink, the heat sink comprising an LED-supporting region and heat-dissipating surfaces extending therefrom; and an LED illuminator secured with respect to the LED-supporting region.

11. An LED light fixture comprising:

a frame defining a forward region and a rearward region;

the rearward region having (a) an enclosure defining a chamber enclosing electronic LED power circuitry, and (b) a rearmost portion adapted for securement to a support member;

the forward region having (i) a heat sink and (ii) open spaces within the frame on either side of the heat sink, the heat sink comprising an LED-supporting region and heat-dissipating surfaces extending therefrom, the heat sink and the frame being formed as a single piece; and an LED illuminator secured with respect to the LED-supporting region.

12. An LED light fixture comprising:

a frame defining a forward region and a rearward region;

the rearward region having (a) an enclosure defining a chamber enclosing electronic LED power circuitry, and (b) a rearmost portion adapted for securement to a support member;

the forward region having (i) a heat sink and (ii) open spaces within the frame on either side of the heat sink, the heat sink being open to ambient-fluid flow and comprising a central portion and peripheral portions, the central portion comprising an LED-supporting region, the peripheral portions having peripheral heat-dissipating surfaces along lateral sides of the heat sink; and an LED illuminator secured with respect to the LED-supporting region.

13. The LED light fixture of claim 12 wherein the central portion has a plurality of fins protruding in a direction opposite the LED illuminator.

14. The LED light fixture of claim 13 wherein the heat sink comprises at least one central-portion venting aperture adjacent to the enclosure and facilitating ambient-fluid flow to and from the heat-dissipating surfaces of the central portion.

15. The LED light fixture of claim 14 wherein the central-portion venting aperture is partially defined by the enclosure.

16. An LED light fixture which in plan view comprises central and outward portions, the central portion comprising (a) an enclosure with LED power circuitry therein, (b) a heat sink secured with respect to the enclosure and supporting an LED illuminator and (c) a mount adapted for securement to a support member, the outward portion defining an outer plan-view shape of the fixture and being secured to the central portion with through-space(s) between the central and outward portions.

17. The LED light fixture of claim 16 wherein the through-space(s) is/are at least along the heat sink.

18. The LED light fixture of claim 17 wherein the through-space(s) along the heat sink is/are on opposite sides thereof.

19. The LED light fixture of claim 18 wherein there are at least two through-space(s), including at least one on each of the opposite sides of the heat sink.

20. The LED light fixture of claim 16 wherein the outward portion has an outer perimeter which in plan view is substantially similar to the footprint of a cobrahead non-LED light fixture.

21. An LED light fixture comprising (a) a housing, (b) a heat sink secured with respect to the housing, the heat sink comprising forward, rearward and lateral sides, and (c) an LED illuminator on the heat sink, the LED illuminator comprising (Ti) at least one LED emitter in thermal connection with the heat sink and (ii) an optical member over at least one LED emitter for illumination therebelow, the heat sink comprising downwardly-extending shield members at the lateral sides thereof configured and dimensioned to block illumination.

22. The LED light fixture of claim 21 wherein:

the optical member is configured for directing emitter light predominantly toward the forward side; and the central heat-sink portion has a downwardly-extending rearward shield member at the rearward side thereof configured and dimensioned to block rearward illumination, the rearward shield member extending to a position lower than a lowermost outer-surface portion of the optical member.

23. The LED light fixture of claim 22 wherein the housing comprises a main portion including a forward wall-portion with the heat sink extending forwardly therefrom, the forward wall-portion of the housing at least partially defining the rearward shield member.

24. The LED light fixture of claim 23 wherein the main portion of the housing comprises (a) a housing body including the forward wall-portion and (b) a cover member movably secured with respect to the housing body, the housing body and the cover member forming a substantially closed chamber.

25. The LED light fixture of claim 24 wherein the cover member has a forward end secured to the forward wall-portion of the housing body and at least partially defining the rearward shield member.

26. The LED light fixture of claim 25 wherein the cover member also has a rearward end opposite the forward end and a cover wall extending therebetween, the cover wall including a lowermost portion which is at a position lower than the lowermost position of the rearward shield member to further block rearward illumination.

27. The LED light fixture of claim 24 wherein:

the fixture comprises a frame including the an open forward region and a rearward region which has a rearmost portion adapted for securement to a support member; and the heat sink is positioned within the forward region and secured with respect to the frame with open spaces remaining therebetween.

28. The light fixture of claim 27 wherein the frame and the main portion of the housing are formed as a single piece.

29. The light fixture of claim 28 wherein the heat sink and the frame are formed as a single piece.

30. The LED light fixture of claim 27 wherein:

the housing further comprises a forward portion extending from the main portion of the housing and defining the forward region, the forward portion having outer lateral edges; and open spaces are defined between the lateral sides of the heat sink and the outer lateral edges of the forward portion of the housing, whereby the lateral shield members block lateral light from reflection by the forward portion of the housing.

* * * * *